(12) United States Patent
Rytkönen et al.

(10) Patent No.: US 12,428,291 B2
(45) Date of Patent: Sep. 30, 2025

(54) IN-PLANE AND OUT-OF-PLANE ACCELEROMETER

(71) Applicant: Murata Manufacturing Co., Ltd., Nagaokakyo (JP)

(72) Inventors: Ville-Pekka Rytkönen, Klaukkala (FI); Matti Liukku, Helsinki (FI); Anssi Blomqvist, Helsinki (FI)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 18/594,944

(22) Filed: Mar. 4, 2024

(65) Prior Publication Data

US 2024/0300805 A1    Sep. 12, 2024

(30) Foreign Application Priority Data

Mar. 7, 2023    (EP) .................................. 23160328

(51) Int. Cl.
*B81B 3/00*   (2006.01)
*G01P 15/08*   (2006.01)
*G01P 15/125*   (2006.01)

(52) U.S. Cl.
CPC .......... *B81B 3/0062* (2013.01); *G01P 15/125* (2013.01); *B81B 2201/0235* (2013.01);
(Continued)

(58) Field of Classification Search
CPC ........... G01P 15/125; G01P 2015/0814; G01P 15/0802; G01P 15/032–036;
(Continued)

(56) References Cited

U.S. PATENT DOCUMENTS 8,505,380 B2 *   8/2013   Foster ................... G01P 15/125
                                                       73/514.24
8,739,626 B2 *   6/2014   Acar ..................... G01P 15/125
                                                       73/504.04
(Continued)

FOREIGN PATENT DOCUMENTS

EP    2023151 A2    2/2009
EP    2023151 A3    11/2011
EP    3792637 A1    3/2021

OTHER PUBLICATIONS

Tsuchiya, T. et al.; "Dynamic Sensitivity Matrix Measurement for Single-Mass SOI 3-AXIS Accelerometer"; Proceedings of the IEEE International Conference on Micro Electro Mechanical Systems (MEMS) 2012, Paris, France Jan. 29-Feb. 2, 2012, p. 420-423.
(Continued)

*Primary Examiner* — Moazzam Hossain
(74) *Attorney, Agent, or Firm* — ArentFox Schiff LLP

(57) ABSTRACT

A microelectromechanical accelerometer is provided that includes one or more proof masses. The accelerometer also includes four sets of stator combs that form a set of four measurement capacitors together with rotor combs. Some rotor combs have a positive offset in a direction in the device plane in relation to stator, while others have a negative offset. Some rotor combs have a negative offset in a direction perpendicular to the device plane in relation to stator combs. Moreover, some stator combs have a negative offset in the direction perpendicular to the device plane in relation to rotor combs.

20 Claims, 21 Drawing Sheets

(52) U.S. Cl.
CPC ............... *B81B 2203/0136* (2013.01); *B81B 2203/0154* (2013.01); *B81B 2203/051* (2013.01); *B81B 2203/058* (2013.01); *G01P 2015/0814* (2013.01); *G01P 2015/084* (2013.01); *G01P 2015/0848* (2013.01); *G01P 2015/0877* (2013.01)

(58) Field of Classification Search
CPC .......... B81B 3/0062; B81B 2203/0136; B81B 2201/0235; B81B 2203/058
See application file for complete search history.

(56) References Cited

U.S. PATENT DOCUMENTS

| | | | |
|---|---|---|---|
| 10,436,812 B2 * | 10/2019 | Enjalbert | ............... G01P 15/18 |
| 2010/0024552 A1 * | 2/2010 | Foster | ............... G01P 15/131 |
| | | | 73/514.32 |
| 2010/0326191 A1 * | 12/2010 | Foster | ............... G01C 19/5719 |
| | | | 73/514.32 |
| 2014/0090468 A1 | 4/2014 | Fu | |
| 2017/0010300 A1 | 1/2017 | Kigure et al. | |
| 2021/0140995 A1 * | 5/2021 | Reinke | ............... G01P 15/125 |
| 2023/0384474 A1 * | 11/2023 | Wu | ............... G01V 7/04 |

OTHER PUBLICATIONS

Extended European Search Report issued for EP Application No. 23160328.3, date of mailing Jun. 28, 2023.

* cited by examiner (i)

(ii)

(iii)

(i)

(ii)

(i)

(ii)

IN-PLANE AND OUT-OF-PLANE ACCELEROMETER

CROSS REFERENCE TO RELATED APPLICATION

The application claims priority to European Patent Application No. 23160328.3, filed Mar. 7, 2023, the entire contents of which are hereby incorporated by reference.

TECHNICAL FIELD

This disclosure relates to MEMS accelerometers, and particularly to accelerometers where proof masses move both in the device plane and out of the device plane.

BACKGROUND

MEMS accelerometers can be equipped with capacitors which are used to measure the movement of a proof mass. FIG. 1a illustrates a proof mass 11 which lies in an xy-plane in its rest position and a fixed structure 12 next to the proof mass. The proof mass comprises a set of comb electrodes (such as 111) which are interdigitated with corresponding comb electrodes (112) on the fixed structure 12. If both the proof mass 11 and the fixed structure 12 are made of a conducting material, they together form a capacitor. Any movement of the proof mass 11 in relation to the fixed structure 12 in the y-direction can be detected as a change in capacitance.

If the interdigitation of the comb electrodes is symmetric as in FIG. 1a, so that the distances from each fixed comb to the adjacent proof mass combs are equal in the positive and negative y-directions, then movement in the positive y-direction cannot be distinguished from movement in the negative y-direction in the output signal measured from the capacitor. It is therefore advantageous to create an offset in the interdigitation in either the positive or the negative y-direction.

This is illustrated in FIG. 1b, where the fixed comb 121 is closer to proof mass comb 112 than to 111 when the proof mass is in its rest position. When the proof mass moves away from its rest position in the positive y-direction (indicated by the y-axis arrow), the capacitance will increase. When the proof mass moves in the negative y-direction, the capacitance will decrease. However, the output signal obtained with the arrangement illustrated in FIG. 1b will have a strongly nonlinear dependence on proof mass displacement.

A further configuration is illustrated in FIG. 1c. As shown, this accelerometer contains two separate fixed structures 12 and 13 which are electrically isolated from each other. Two separate capacitive output signals can now be measured—a first signal from capacitor 142 which is formed between proof mass 11 and fixed structure 12, and a second signal from capacitor 143 which is formed between 11 and 13. It can be seen in FIG. 1c that the interdigitation of the combs in capacitor 142 has a positive offset, like in FIG. 1b. But the interdigitation has a negative offset in the other capacitor 143. It is known that a differential measurement signal, obtained by subtracting the first signal from the second, can with this interdigitation geometry exhibit an almost linear dependence on proof mass displacement.

It is also possible to implement two alternating and electrically separated sets of fixed comb fingers adjacent to a proof mass. A separate output signal can then be measured from each set. This has been illustrated in FIG. 1d, where fixed combs 124 form one set and fixed combs 125 form another set (the fixed structure where these combs are attached has been omitted from the figure). Combs 124 form a first capacitor with proof mass combs 113, and combs 125 form a second capacitor. It can be seen in FIG. 1d that the interdigitation of these combs has a positive offset in the 113-124 capacitor and a negative offset in the 113-125 capacitors.

Some proof masses are designed to move in a z-direction which is perpendicular to the plane of the proof mass. Such proof masses may also comprise comb electrodes which are interdigitated with fixed comb electrodes in the xy-plane, so that these electrodes may together form a capacitor. FIG. 2a illustrates an xz-cross-section of a capacitor where mobile comb electrodes 21 are aligned with fixed comb electrodes 22 when the proof mass is in its rest position. 2b illustrates the same cross-section after the proof mass (and the mobile comb electrodes 21) has moved in the negative z-direction. A general problem with using interdigitated combs for measuring movement in the z-direction is that both proof mass movement in the positive z-direction (not illustrated) and proof mass movement in the negative z-direction will decrease the overlap between the electrodes, which reduces the capacitance. Movement in the positive direction is therefore indistinguishable from movement in the negative direction. Movement in the z-direction is therefore typically measured by other means, such as parallel-plate capacitive measurements which require separate electrodes.

U.S. Patent Publication No. U.S. 2017/010300 discloses an accelerometer where capacitors with interdigitation offsets are used to measure the in-plane movement of a mass section.

Moreover, the publication Tsuchiya et al, Dynamic sensitivity Matrix Measurement for Single-mass SOI 3-axis Accelerometer, Conference Proceedings 16 MEMS 2012, Paris 29.1.-2.2.2012, p. 420-423, discloses an accelerometer where two pairs of comb electrodes have different heights in fixed and movable combs. x- and y-acceleration is detected with single-differential measurements. z-acceleration is detected with a double-differential measurement. The z-axis measurement requires measurement capacitors on four different sides of the moving mass.

SUMMARY OF THE INVENTION

In view of the foregoing, it is an object of this disclosure to provide a multi-axis accelerometer with a simple measurement arrangement. In an exemplary aspect, a microelectromechanical accelerometer is provided that includes at least one proof mass in a device layer that defines an xy-plane and a z-direction that is perpendicular to the xy-plane, with the at least one proof mass including a plurality of rotor combs that extend in an x-direction of the xy-plane; and four fixed sets of stator combs that extend in the x-direction and that are each electrically insulated from the other sets of stator combs, and each set of stator combs is interdigitated with rotor combs, such that the four sets of stator combs form a set of four measurement capacitors together with the rotor combs of the at least one proof mass. Moreover, according to the exemplary aspect, the at least one proof mass is configured to move at least in a y-direction of the xy-plane and the z-direction relative to the four sets of stator combs, the set of four measurement capacitors comprises first, second, third and fourth pairs, a position of the rotor combs has a positive offset in the y-direction in relation to stator combs in the first pair when the at least one proof mass is in a rest position, such that respective capacitances increase in the first pair when the at least one proof mass moves away from the rest position in a positive y-direction and decrease when the at least one proof mass moves away from the rest position in a negative y-direction, the position of the rotor combs has a negative offset in the y-direction in relation to the stator combs in the second pair when the at least one mass is in the rest position, such that respective capacitances decrease in the second pair when the at least one proof mass moves away from the rest position in the positive y-direction and increase when the at least one proof mass moves away from the rest position in the negative y-direction, the position of the rotor combs has a negative offset in the z-direction in relation to the stator combs in the third pair when the at least one proof mass is in a respective rest position, such that respective capacitances decrease in the third pair when the at least one proof mass moves away from the rest position in a negative z-direction, and increase or remain constant when the at least one proof mass moves away from the rest position in a positive z-direction, and the position of the stator combs has a negative offset in the z-direction in relation to the rotor combs in the fourth pair when the at least one proof mass is in the rest position, so that respective capacitances decrease in the fourth pair when the at least one proof mass moves away from the rest position in a positive z-direction, and increase or remain constant when the at least one proof mass moves away from the rest position in a negative z-direction.

The exemplary aspects are based on the idea of implementing comb offsets in both the in-plane direction and the out-of-plane direction in a set of measurement capacitors. An advantage of this arrangement is that the same measurement capacitors can be used for detecting both in-plane and out-of-plane movement with double-differential measurements.

BRIEF DESCRIPTION OF THE DRAWINGS

In the following the disclosure will be described in greater detail by means of preferred embodiments with reference to the accompanying drawings, in which.

DETAILED DESCRIPTION

Figure 1A:
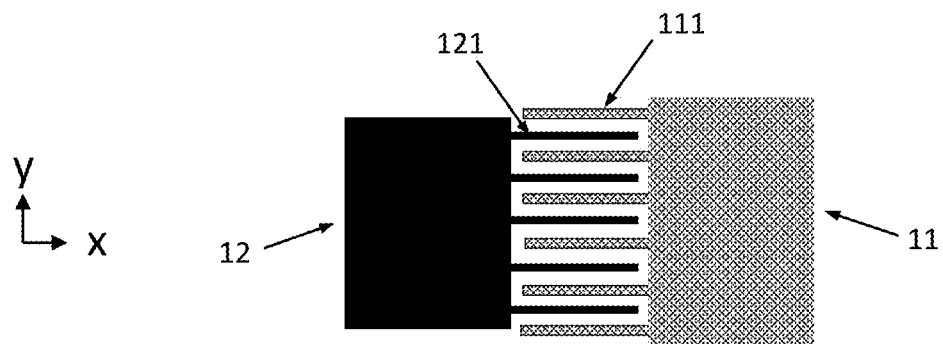
FIGS. 1a-1d illustrate measurement capacitors known from the prior art.
Figure 1B:
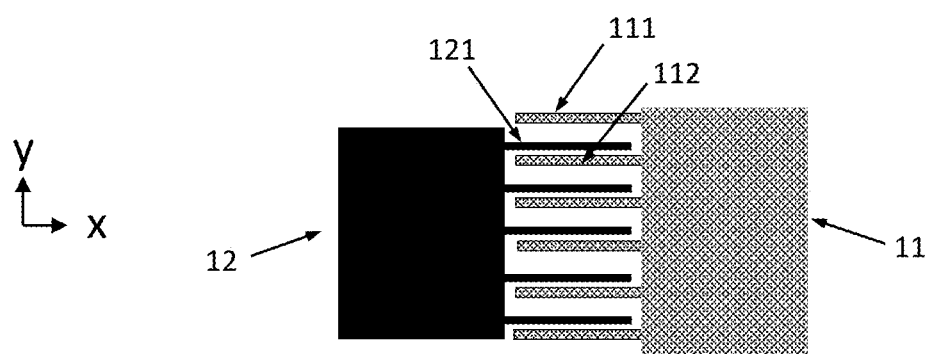
Figure 1C:
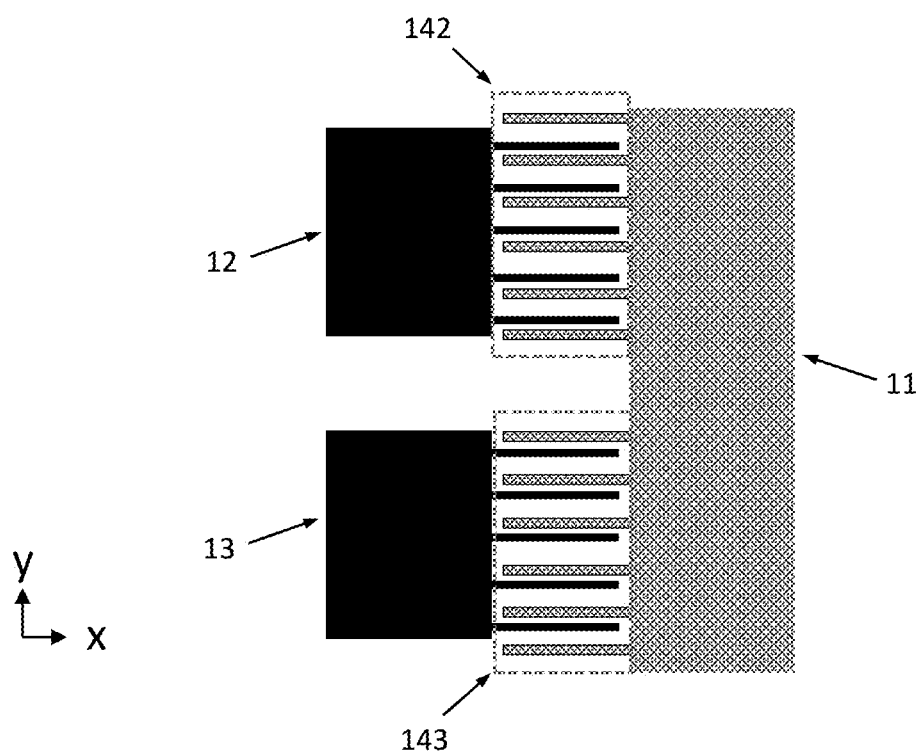
Figure 1D:
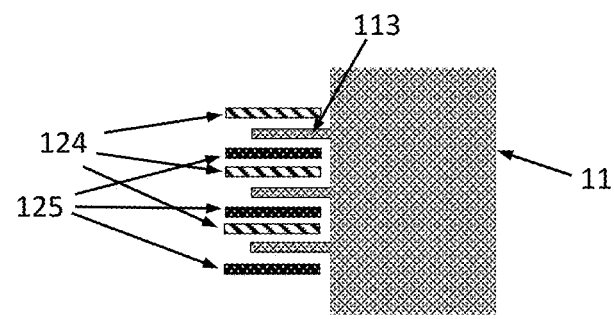
Figure 2A:
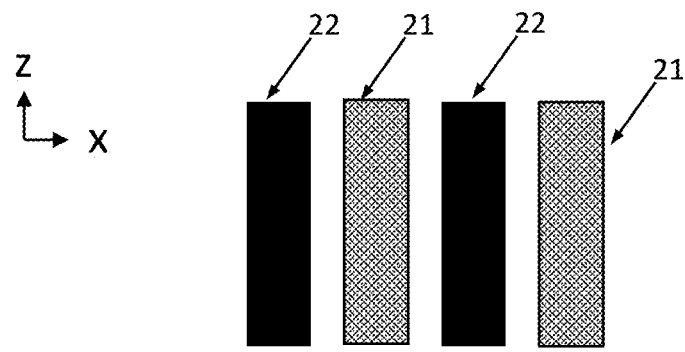
FIGS. 2a-2b also illustrate measurement capacitors known from the prior art.
Figure 2B:
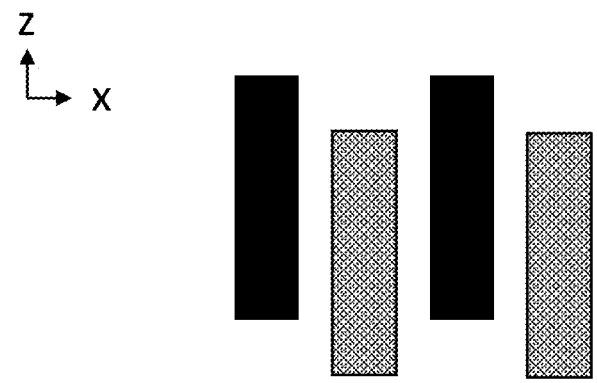

This disclosure describes a microelectromechanical accelerometer comprising one or more proof masses in a device layer. The device layer defines an xy-plane and a z-direction which is perpendicular to the xy-plane. The one or more proof masses comprise rotor combs which extend in the x-direction.

The accelerometer also comprises four fixed sets of stator combs which extend in the x-direction. Each of the four sets of stator combs is electrically insulated from the other three of the four sets of stator combs. Each set of stator combs is interdigitated with rotor combs, so that the four sets of stator combs form a set of four measurement capacitors together with the rotor combs.

The one or more proof masses are mobile at least in the y-direction and the z-direction in relation to the four sets of stator combs.

The set of four measurement capacitors comprises a first pair and a second pair, so that each of the four measurement capacitors belongs to either the first pair or the second pair.

The position of the rotor combs has a positive offset in the y-direction in relation to stator combs in the first pair when the one or more proof masses are in their rest position, so that capacitances increase in the first pair when the one or more proof masses move away from the rest position in a positive y-direction and decrease when the one or more proof masses move away from the rest position in a negative y-direction.

The position of the rotor combs has a negative offset in the y-direction in relation to stator combs in the second pair when the one or more proof masses are in their rest position, so that capacitances decrease in the second pair when the one or more proof masses move away from the rest position in the positive y-direction and increase when the one or more proof masses move away from the rest position in the negative y-direction.

The set of four measurement capacitors also comprises a third pair and a fourth pair, so that each of the four measurement capacitors belongs to either the third pair or the fourth pair.

The position of the rotor combs has a negative offset in the z-direction in relation to stator combs in the third pair when the one or more proof masses are in their rest position, so that capacitances decrease in the third pair when the one or more proof masses move away from the rest position in a negative z-direction, and increase or remain constant when the one or more proof masses move away from their rest position in a positive z-direction.

The position of the stator combs has a negative offset in the z-direction in relation to rotor combs in the fourth pair when the one or more proof masses are in their rest position, so that capacitances decrease in the fourth pair when the one or more proof masses move away from the rest position in a positive z-direction, and increase or remain constant when the one or more proof masses move away from their rest position in a negative z-direction.

The device layer may be a device wafer, for example a silicon wafer. Alternatively, the device layer may be a layer which has been deposited on a substrate. The device layer may also be called a structural layer. The device layer may be a silicon layer.

The device layer comprises fixed parts which are immobile in relation to the surrounding device package. The device layer also comprises parts which are mobile in relation to the device package and the fixed parts. These mobile parts include the proof mass and flexible suspenders which attach the proof mass to a fixed part. The point where a suspender is attached to a fixed part may be called an anchor point.

The micromechanical structures which form the mobile parts of the accelerometer can be prepared in the device layer by etching the layer. When the structures are completed, the fixed parts of the device layer may form a supporting body which surrounds the mobile parts in the device plane. The device layer itself may be structurally supported by a separate, thicker support wafer or substrate during manufacturing and/or in the finished accelerometer. The support wafer may be called a handle wafer.

The word "proof mass" refers in this disclosure to a mobile part. The proof mass moves as a rigid body in relation to the fixed parts when the device undergoes acceleration. The proof masses described in this disclosure may for example be made of silicon. The movement of the proof mass in response to acceleration is determined by the direction and magnitude of the acceleration, by the flexible properties of the suspenders, and by the size/weight of the proof mass. If multiple proof masses are coupled together, the movement will also be determined by the properties of the coupling springs which join the proof masses to each other.

The proof mass may alternatively be called a rotor, and a fixed structure which is adjacent to the proof mass may be called a stator. This terminology is used in this disclosure to distinguish between capacitor combs formed on the mobile proof mass (rotor combs) and capacitor combs formed on an adjacent fixed structure (stator combs). Rotor combs are interdigitated with stator combs in the device plane in all embodiments presented in this disclosure.

In this disclosure the device plane is illustrated and referred to as the xy-plane. The device plane is determined by the device layer. Proof masses and suspension structures may be formed in the device layer by etching. The z-axis, which may be called the vertical axis, is perpendicular to the xy-plane. In this disclosure, the term "vertical", and related terms such as "top" and "bottom", refer only to a direction which is perpendicular to the device plane. They do not imply anything about how the device should be orientated during manufacturing or use.

The center of gravity of each proof mass may lie in the device plane when the proof mass is in its rest position. The proof mass in its rest position when accelerometer isn't experiencing any acceleration or gravitational pull.

Motion where the center of gravity of a proof mass moves in the z-direction may be referred to as out-of-plane motion, or motion out of the device plane. This motion may for example be linear translation in the z-direction. The entire proof mass moves in the same direction in linear translation.

The proof mass may alternatively undergo rotation motion, where it rotates about an axis. Motion where the proof mass undergoes rotation about an axis in the device plane, so that one end of the proof mass moves in a positive z-direction while the other moves in a negative z-direction, is also out-of-plane motion. The center of gravity may remain in the device plane in this rotational out-of-plane motion, or it may move out of the device plane.

Motion where the center of gravity of a proof mass moves in the xy-plane, or where the proof mass rotates about a vertical axis, may be referred to as in-plane motion, or motion in the device plane. The suspension structures may be designed so that the proof mass undergoes linear translation in response to acceleration in a first direction (for example the x-direction) and rotation in response to acceleration in a second direction (for example the z-direction). This will be illustrated with examples below.

The term "offset", with reference to the interdigitation of rotor and stator combs, has the following meaning in this disclosure. Rotor combs have a positive offset in the y-direction in relation to stator combs (in the proof mass rest position) if the combs are interdigitated so that each rotor comb is closer to the stator comb which is adjacent to rotor comb on the positive y-side than to the stator comb which is adjacent to the rotor comb on the negative y-side. Correspondingly, a negative offset in the y-direction means interdigitation where each rotor comb is closer to the stator comb placed on the negative y-side than to the stator comb placed on the positive y-side. The same applies for offset in the x-direction.

In the z-direction the term "offset" refers to the relative positioning, or alignment, of rotor and stator combs in the rest position. Rotor combs have a negative offset in the z-direction in relation to stator combs (in the proof mass rest position) if the top surface of the rotor combs (i.e., the surface which faces the positive z-direction) has a smaller z-coordinate than the top surface of the stator combs. The rotor combs may in this case have been recessed from the top side in relation to the stator combs. As explained in more detail below, when rotor combs have a negative offset in relation to stator combs, the bottom surface of the rotor combs may be level with the bottom surface of the stator combs. Alternatively, the bottom surface of the rotor combs may have a smaller z-coordinate than the bottom surface of the stator combs. In the latter case, the stator combs may have been recessed from the bottom side in relation to the rotor combs.

In this context, recessing may be performed in an etching process where the device layer is selectively etched in an area where the structure which should be recessed is located. In other words, if the top surface of the rotor combs is recessed but the top surface of stator combs is not, then the top surface of the stator combs may be aligned (it may have the same z-coordinate) with the top surface of the device layer. Correspondingly, if the bottom surface of the stator combs is recessed but the bottom surface of rotor combs is not, then the bottom surface of the rotor combs may be aligned with the bottom surface of the device layer.

When stator combs have a negative offset in the z-direction in relation to rotor combs (in the proof mass rest position), all relationships described in the previous two paragraphs are reversed. It may be noted that the relationship "combs X have a negative offset in relation to combs Y" can alternatively be stated as "combs Y have a positive offset in relation to combs X".

The one or more proof masses may comprise a single proof mass. Alternatively, they may comprise two proof masses which are coupled to each other. The one or more proof masses may comprise more than two proof masses which are coupled to each other. This will be illustrated with examples below. Throughout this disclosure, the one or more proof masses are mobile at least in the y-direction and the z-direction. Furthermore, the one or more proof masses may move simultaneously in the same y-direction in response to acceleration in the y-direction, and they may move simultaneously in the same z-direction in response to acceleration in the z-direction. If the one or more proof masses are mobile also in the x-direction, then they may also move simultaneously in the same x-direction in response to acceleration in the x-direction. Some examples presented in this disclosure may discuss embodiments with a single proof mass, but all technical features presented in such examples apply also to the case where more than one proof mass are used.

In any embodiment presented in this disclosure, the one or more proof masses may comprise a first side and a second side. The first side may be opposite to the second side in an x-direction which is perpendicular to the y-direction. The set of four measurement capacitors may comprise a first, a second, a third and a fourth measurement capacitor, and the first and second measurement capacitors may be located on the first side of the one or more proof masses, while the third and fourth measurement capacitors may be located on the second side of the one or more proof masses. This arrangement may be particularly advantageous if the one or more proof masses undergoes rotational out-of-plane movement. However, another alternative is to place all four measurement capacitors on the same side of the one or more proof masses.

One-Mass Exemplary Aspect

In an exemplary aspect, the one or more proof masses may be a single proof mass that is suspended from one or more fixed first anchor points by a first suspension structure. The first suspension structure may allow the single proof mass to move in linear translation in the y-direction when the accelerometer undergoes acceleration in the y-direction. The first suspension structure may also allow the single proof mass to move in linear translation in the z-direction when the accelerometer undergoes acceleration in the z-direction. Alternatively, the first suspension structure may allow the single proof mass to rotate about an axis in the device plane when the accelerometer undergoes acceleration in the z-direction.

Figure 3A:
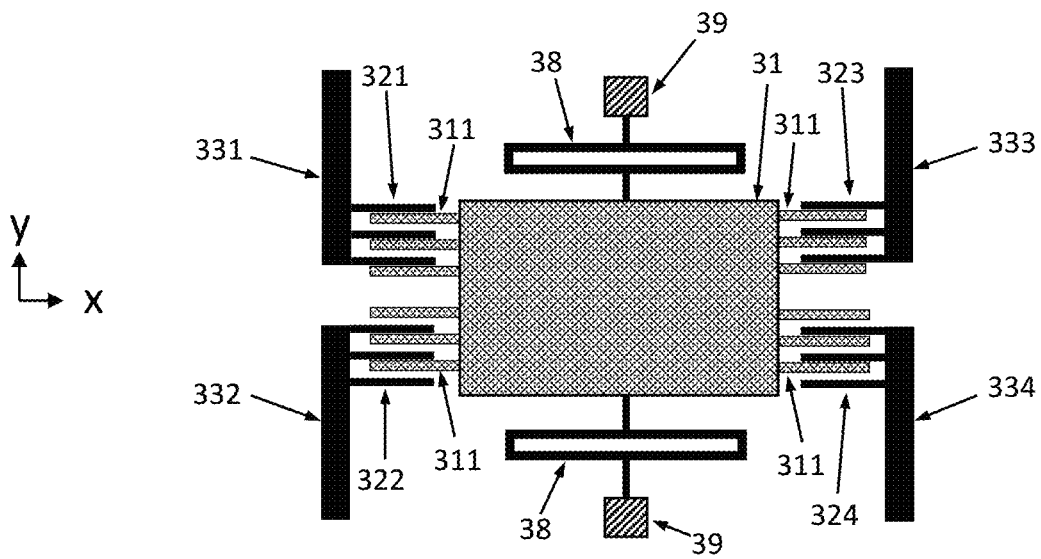
FIGS. 3a-3d illustrate accelerometers with one proof mass according to an exemplary aspect.

FIG. 3a illustrates an accelerometer which comprises one proof mass 31 with rotor combs 311. The proof mass is suspended from anchor points 39 by suspenders 38. The accelerometer also comprises four sets of stator combs 321-324. These stator combs are fixed parts. They may be attached to larger fixed structures, illustrated as 331-334 in FIG. 3a. These fixed structures 331-334, and the stator combs 321-324, may for example be formed in the fixed parts of the device layer which are adjacent to the proof mass 31.

Figure 3B:
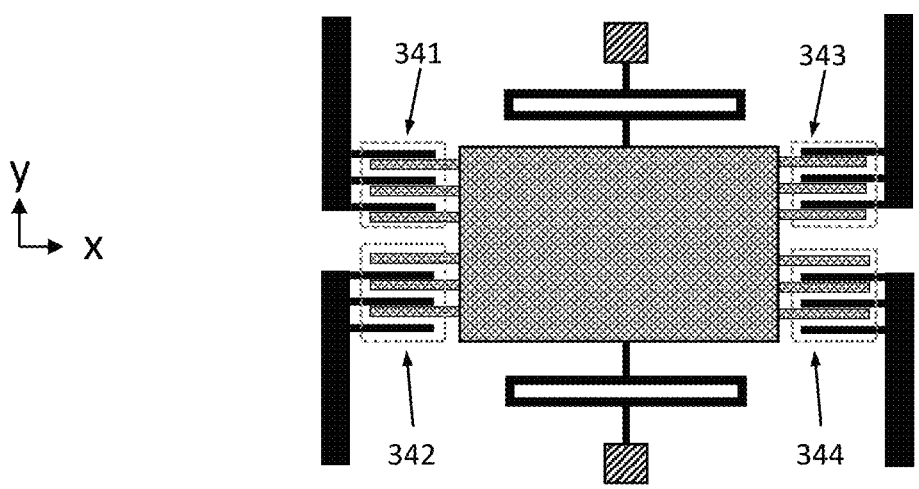

The four sets of stator combs 321-324 are electrically insulated from each other. This insulation can be achieved in many different ways. Four separate measurement capacitors, illustrated as 341-344 in FIG. 3b, are formed when each set of stator combs 321-324 is interdigitated with a corresponding set of rotor combs 311. The set of rotor combs which belongs to a particular measurement capacitor may, but do not necessarily have to, be insulated from each other. In other words, if the proof mass 31 is conductive or semiconductive, the proof mass 31 can be set to a given electric potential. Four separate measurement signals can be obtained from the four measurement capacitors since the stator combs 321-324 are electrically separated from each other.

If the set of rotor combs would be divided into four electrically separated sets, then the four sets of stator combs would not need to be electrically insulated from each other. However, this option will not be discussed further in this disclosure.

In FIG. 3a, each set of stator combs is spatially separated from the other sets, so that each stator comb is flanked on both sides by stator combs from the same set (except for the outermost combs). In other words, the stator combs 321 of the first measurement capacitor 341 all have a larger y-coordinate than any of the stator combs 322 of the second measurement capacitor 342. The first measurement capacitor 341 is thereby separated from the second measurement capacitor 342 in the y-direction. The stator combs 323 of the third measurement capacitor 343 all have a larger y-coordinate than any of the stator combs 324 of the fourth measurement capacitor 344. The third measurement capacitor 343 is thereby separated from the fourth measurement capacitor 344 in the y-direction.

Figure 3C:
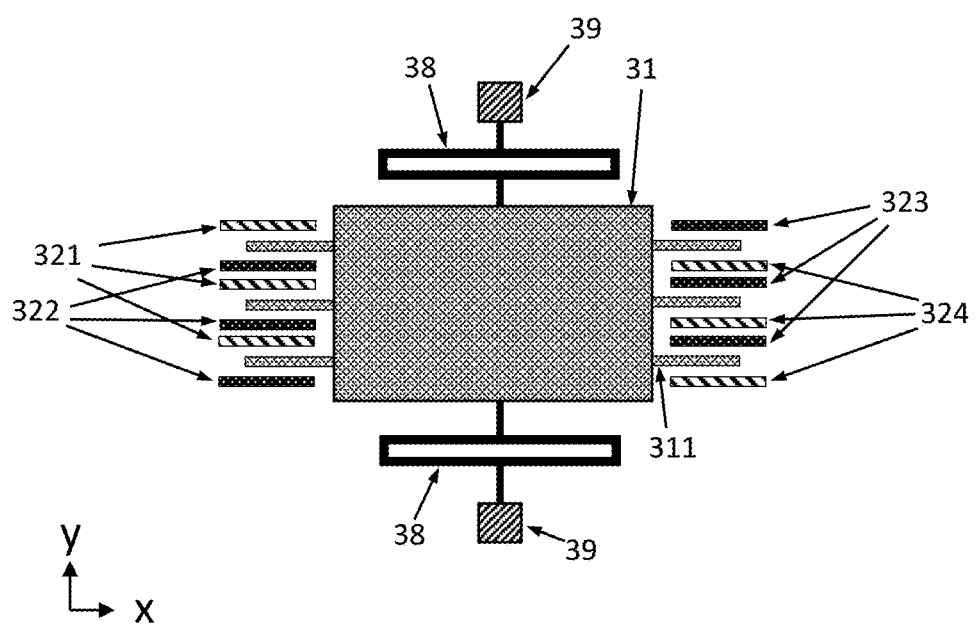

However, the four sets of stator combs may alternatively be built pairwise in an alternating arrangement, as FIG. 3c illustrates. In this case the stator combs 321 of the first measurement capacitor are arranged in alternating order in the y-direction with the stator combs 322 of the second measurement capacitor, so that each rotor comb 311 in the first and second measurement capacitors is flanked by one stator comb 321 from the first measurement capacitor on one y-direction side and by one stator comb 322 from the second measurement capacitor on the opposite y-direction side. The stator combs of the third measurement capacitor 323 are arranged in alternating order in the y-direction with the stator combs 324 of the fourth measurement capacitor, so that each rotor comb 311 in the third and fourth measurement capacitors is flanked by one stator comb 323 from the third measurement capacitor on one y-direction side and by one stator comb 324 from the fourth measurement capacitor on the opposite y-direction side.

The fixed structures where the stator combs are attached have been omitted for clarity, but the four sets of stator combs 321-324 are electrically isolated from each other in FIG. 3c, just as they are in FIG. 3a.

Sets 321 and 322 lie on the left side of the proof mass 31, while sets 323 and 324 lie on the right side. The combs in set 321 alternate with the combs in set 322, so that each comb in set 321 (except possibly the outermost) is flanked on one side by a comb from set 322 and on the other side by a rotor comb 311. Conversely, each comb in set 322 (except possibly the outermost) is flanked on one side by a comb from set 321 and on the other side by a rotor comb 311. The same applies to sets 323 and 324.

Figure 3D:
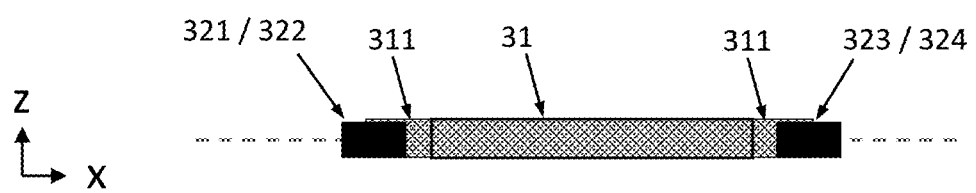
Figure 3D:
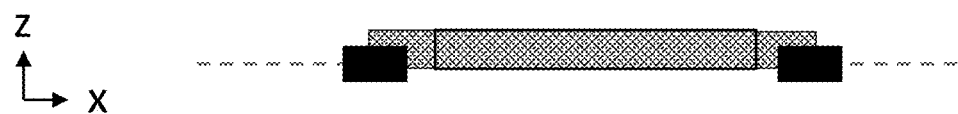
Figure 3D:
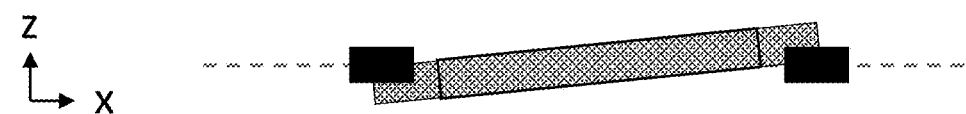

FIG. 3d illustrates an xz-cross section of the proof mass 31, the rotor combs 311 and the sets of stator combs 321-324. The top figure (i) shows the proof mass 31 in its rest position. The middle figure (ii) illustrates linear translation out of the device plane. The bottom figure (iii) illustrates rotation out of the device plane. The suspension may be constructed so that it flexibly allows the alternative (ii) or (iii) which is the desired mode of out-of-plane motion, but stiffly resists the other if it is undesired.

This disclosure describes a first division of the four measurement capacitors into a first pair and a second pair, and also a second division into a third pair and a fourth pair. In other words, in the first division each measurement capacitor is assigned either to the first or the second pair, and in the second division each capacitor is assigned either to the third or the fourth pair. The reason for this overlapping division is that:

the y-axis interdigitation of rotor and stator combs should have a positive offset in two measurement capacitors (the first pair), the y-axis interdigitation of rotor and stator combs should have a negative offset in two measurement capacitors (the second pair), so that a differential output signal measured between the first and second pairs exhibits an almost linear displacement on y-axis displacement, the alignment of rotor combs to stator combs in the z-direction should have a negative offset in two measurement capacitors (the third pair), but it makes no difference if the y-axis interdigitation has a positive or negative offset in these two capacitors, the alignment of stator combs to rotor combs in the z-direction should have a negative offset in two measurement capacitors (the fourth pair), but it makes no difference if the y-axis interdigitation has a positive or negative offset in these two capacitors.

In other words, the two properties discussed in this disclosure, y-axis interdigitation offset and z-axis alignment offset, can be assigned to selected capacitors independently of each other. After deciding to place a given measurement capacitor in the first pair, for example, it can be freely decided whether or not that capacitor should also be placed in the third pair or in the fourth pair. If the four capacitors are numbered 1-2-3-4, the first pair can be any of the combinations 1-2, 1-3, 1-4, 2-3, 2-4 or 3-4. After the first pair has been selected, the second pair is formed by the two capacitors which were not included in the first pair. The third pair can then be selected from any of the six combinations 1-2, 1-3, 1-4, 2-3, 2-4 or 3-4, independently of which capacitors were selected to the first (and second) pairs. After the third pair has been selected, the fourth pair is formed by the two capacitors which were not included in the third pair. These considerations apply to all embodiments presented in this disclosure.

As mentioned above, the interdigitation of rotor and stator combs in the first pair has a positive offset in the y-direction, while the interdigitation of rotor and stator combs in the second pair has a negative offset in the y-direction. In other words, the position of the rotor combs has a positive offset in the y-direction in relation to stator combs in the first pair, but the position of the rotor combs has a negative offset in the y-direction in relation to stator combs in the second pair. This may be called y-axis interdigitation offset. The position of the rotor combs also has a negative offset in the z-direction in relation to the stator combs in the third pair, and the position of stator combs has a negative offset in relation to rotor combs in the z-direction in the fourth pair. This may be called z-axis alignment offset.

FIGS. 4a-4f illustrate y-axis interdigitation offset and z-axis alignment offset in an arrangement where each set of stator combs is spatially separated from the other sets, as in FIG. 3a. Each reference number 45-48 illustrates a set of stator combs, coloured black, in one of the measurement capacitors.

Each subfigure (i)-(iv) illustrates offset design in one and only one of the four measurement capacitors. These designs can be selected freely, as long as all four offset designs are used in the four capacitors. In other words, if capacitor 341 in FIG. 3b is for example designed according to subfigure (i), then the remaining designs (ii)-(iv) can for example be distributed according (ii) 342, (iii) 343 and (iv) 344. Many other distributions are also possible.

Figure 4A:
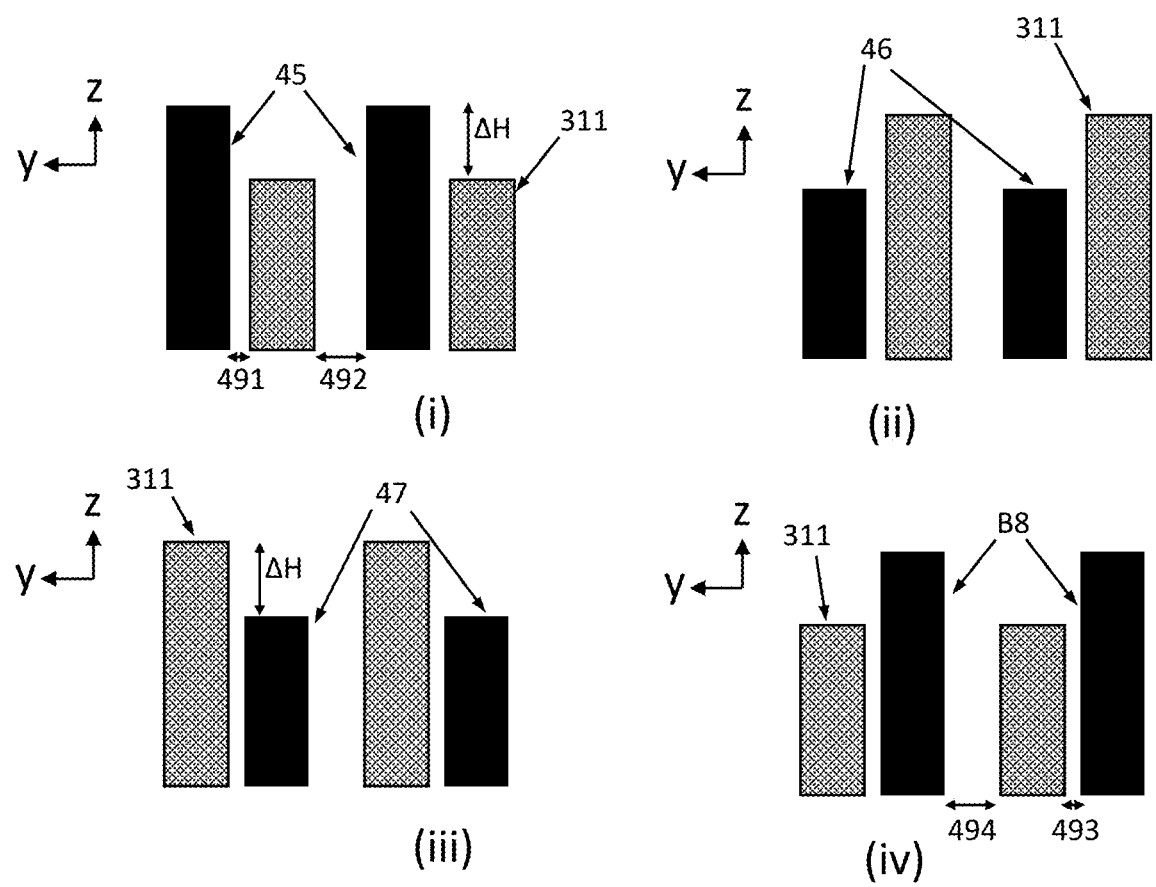
FIGS. 4a-4f illustrate combs offsets in the y- and z-directions according to an exemplary aspect.

The figures illustrate the relative positions of rotor and stator combs when the one or more proof masses are in their rest position. Rotor combs 311 are shown in grey, and stator combs in black. FIG. 4a illustrate interdigitated combs in the four measurement capacitors (i)-(iv). In the illustrated case, the first measurement capacitor (i) belongs to the first pair and the third pair, the second measurement capacitor (ii) belongs to the first pair and the fourth pair, the third measurement capacitor (iii) belongs to the second pair and the fourth pair, and the fourth measurement capacitor (iv) belongs to the second pair and the third pair.

The first pair (i) and (ii) will be described first. A positive interdigitation offset in the y-direction means that the distance 491 from each rotor comb 311 to the stator comb 45 which is adjacent on the positive y-side (indicated by the direction of the y-axis arrow) is less than the distance 492 from that rotor comb to the stator comb 45 which is adjacent on the negative y-side. In all embodiments of this disclosure, the distance or alignment relationship which is illustrated for a small number of combs may apply for all combs in that measurement capacitor. In this particular case, the distances 491 may be equal for all rotor combs 311 in the first measurement capacitor. The distances 492 may also be equal for all rotor combs 311 in the first measurement capacitor.

When 491<492, movement in the positive y-direction increases the capacitance, while movement in the negative y-direction decreases it (as long as the midpoint 491=492 is not crossed). These two movements can thereby be distinguished from each other. The spacing between combs, the suspension structure of the proof mass and the proof mass itself may be designed so that this midpoint is not crossed in normal operation.

In the second pair (iii) and (iv) the interdigitation offset is negative. The distance 493 from each rotor comb 311 to the stator comb 48 which is adjacent on the negative y-side is here less than the distance 494 from that rotor comb to the stator comb 48 which is adjacent on the positive y-side. Consequently, proof mass movement in the negative y-direction increases capacitance, while movement in the positive y-direction decreases capacitance (as long as the midpoint 493=494 is not crossed).

Figure 4B:
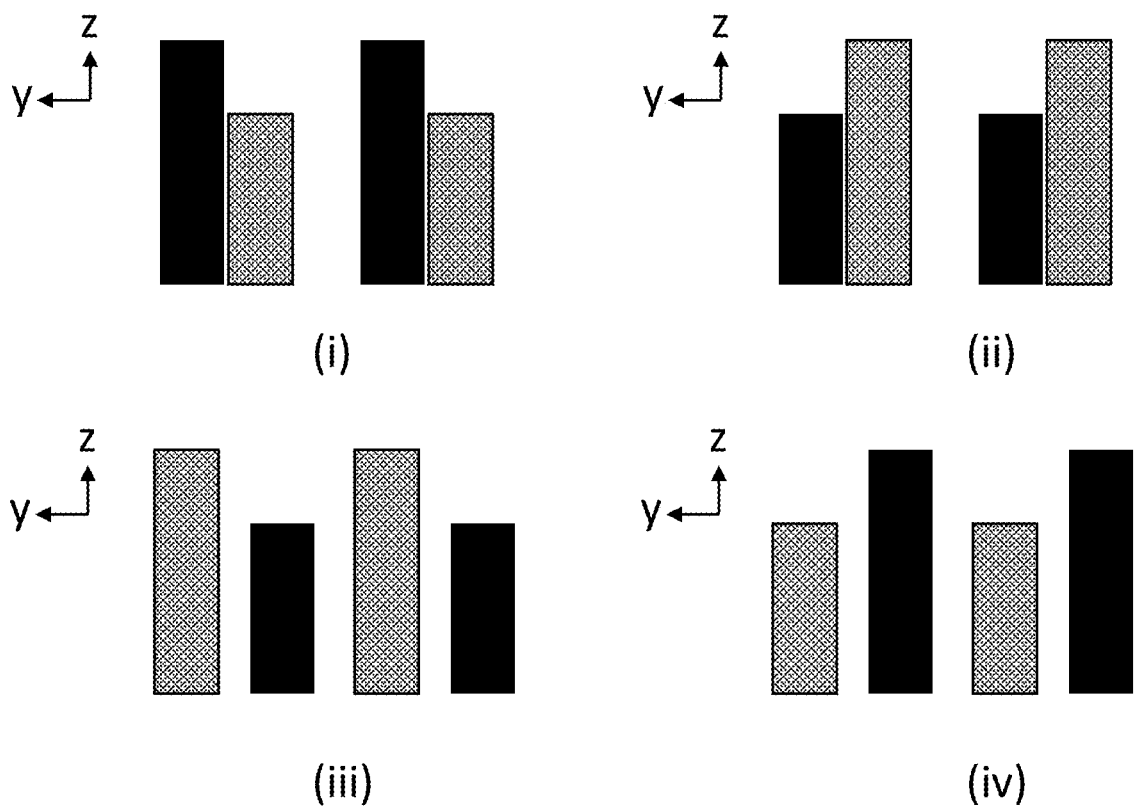

FIG. 4b illustrates the relative positions of the combs in the four measurement capacitors after the proof mass has moved in the positive y-direction. A differential capacitance measurement between the first and second pairs produces an output signal which closely approximates a linear dependence between signal amplitude and proof mass displacement.

The third pair (i) and (iv) will now be described. Each comb has a height in the z-direction. When movement occurs in the z-direction, the capacitance depends on the degree of overlap between rotor and stator combs. As the rotor combs move away from the stator combs, the overlap and the capacitance decrease. As the rotor moves back toward its rest position and the overlap increases, the capacitance increases.

If rotor combs and stator combs would have the same height, and if the bottoms and tops of rotor and stator combs would be aligned with each other (this option has not been illustrated), then it would not be possible to distinguish (in the output signal measured from the capacitor) movement in the positive z-direction from movement in the negative z-direction.

In order to distinguish +z movement from −z movement, alignment offsets in the z-direction have to be introduced. In the third pair (i) and (iv) in FIG. 4a, the bottoms of rotor and stator combs are aligned with each other, but there is a negative offset in the z-direction between the tops, so that the tops of the rotor combs 311 lie a distance ΔH below the tops of the stator combs 45 and 48. This negative offset may for example be created by recessing the rotor combs 311 in a separate recess etching step which can be performed after the rotor and stator combs have been formed in the device layer.

Figure 4C:
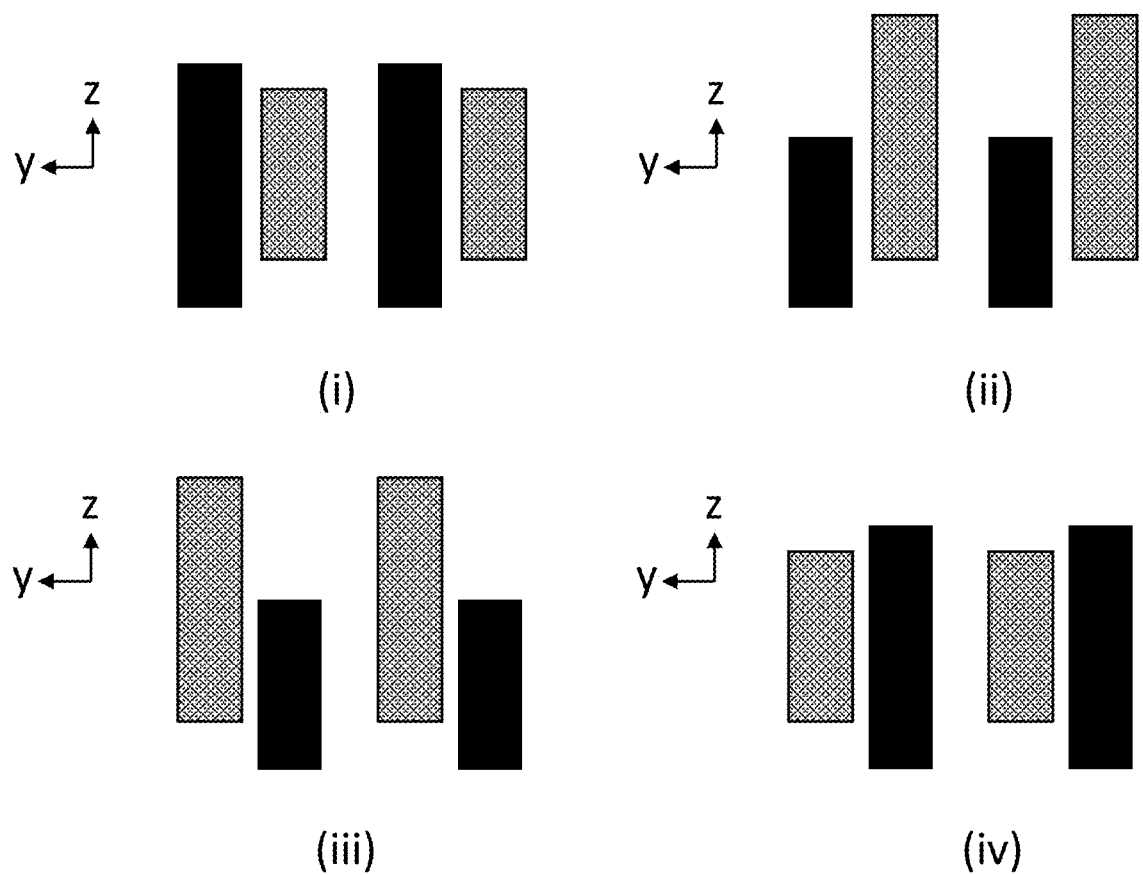

When rotor combs are recessed like this, proof mass movement in the positive z-direction will not influence the capacitance in the third pair significantly because the overlap remains the same. But movement in the negative z-direction will decrease the overlap and the capacitance. FIG. 4c illustrates proof mass movement in the positive y-direction.

Finally, in the fourth pair (ii) and (iii) the bottoms of rotor and stator combs are aligned in the rest position in FIG. 4a, but stator combs have a negative offset in the z-direction because the top of the rotor combs 311 lies a distance ΔH above the tops of the stator combs 46 and 47. Proof mass movement in the negative z-direction will in this case not influence the capacitance significantly in the fourth pair because the overlap remains the same. But movement in the positive z-direction will decrease the overlap and the capacitance, as FIG. 4c illustrates.

FIG. 4c illustrates the capacitors when the proof mass has moved in linear translation in the direction of the z-axis.

Rotation about an axis in the device plane, where rotor combs may move up in some capacitors but down in others, is also possible but has not been separately illustrated.

If the displacement of the proof mass in either z-direction would be so large that the rotor combs would move beyond the stator combs (so that there would be no overlap), the linear capacitance-displacement relationship which prevails with overlap would be lost. The capacitance changes very little as a function of further displacement beyond zero overlap. The combs, the suspension structure of the proof mass, the proof mass itself and possible motion limiters may be designed so that this limit is not crossed in normal operation.

A differential capacitance measurement conducted between the third and fourth pairs yields an output signal which approximates a linear dependence between signal amplitude and proof mass displacement in the z-direction.

Figure 4D:
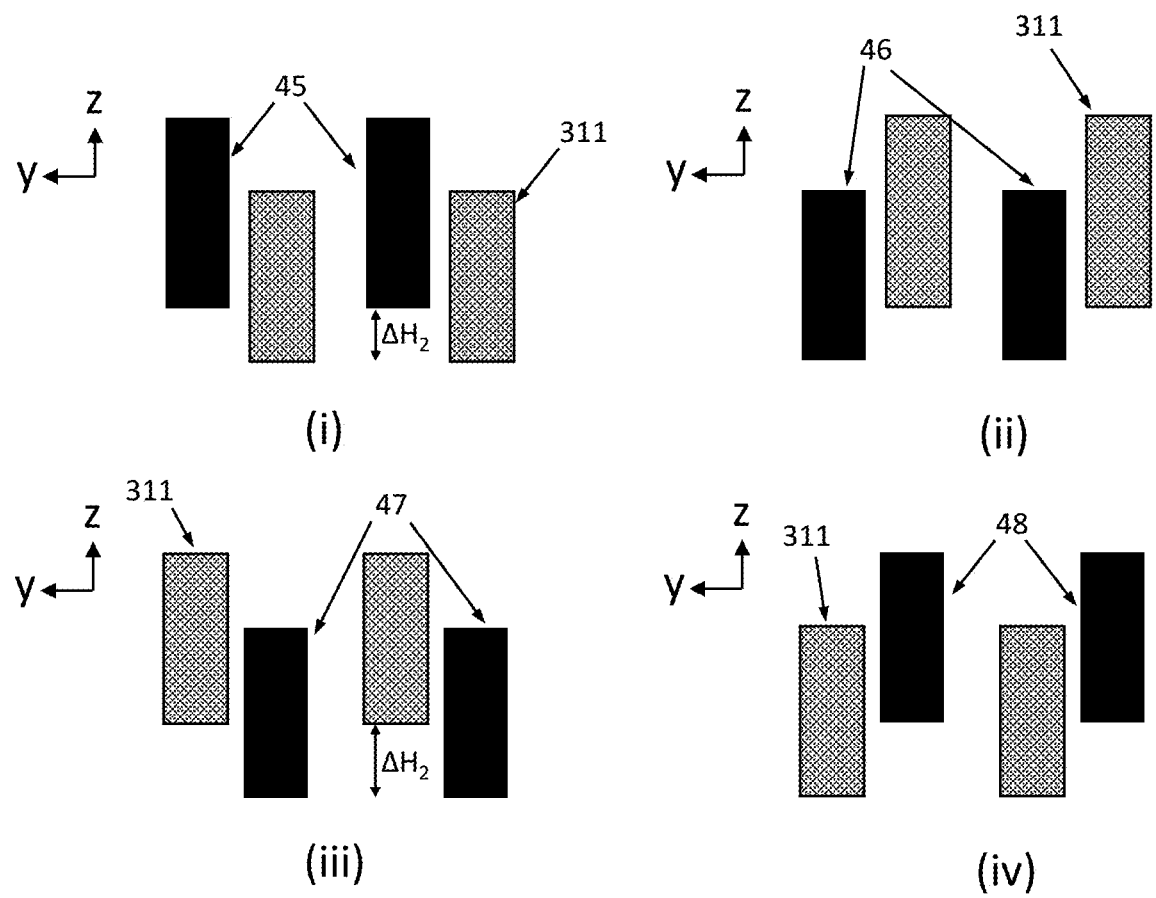

FIG. 4d illustrates an alternative design where the offset in the z-direction in the third and fourth pairs has been implemented both on the top and the bottom of the rotor combs. This figure illustrates the proof mass in its rest position. Just as in FIG. 4a, the tops of the rotor combs 311 lie a distance ΔH below the tops of the stator combs 45 and 48 in measurement capacitors (i) and (iv), and the tops of the rotor combs 311 lies a distance ΔH above the tops of the stator combs 46 and 47 in measurement capacitors (ii) and (iii). Additionally, the bottoms of the rotor combs 311 lie a distance 492 below the bottoms of the stator combs 45 and 48 in measurement capacitors (i) and (iv), and the bottoms of the rotor combs 311 lies a distance 492 above the bottoms of the stator combs 46 and 47 in measurement capacitors (ii) and (iii).

In other words, the negative offsets of the rotor/stator combs in the third and fourth pair apply to the combs as a whole in FIG. 4d. It can be seen that capacitances now decrease in the third pair when the one or more proof masses move away from the rest position in a negative z-direction and increase when the one or more proof masses move away from their rest position in a positive z-direction. Conversely, in the fourth pair capacitances decrease when the one or more proof masses move away from the rest position in a positive z-direction and increase when the one or more proof masses move away from their rest position in a negative z-direction. A differential measurement can be conducted between the third and fourth pairs, just as in the previous example.

The comb configuration shown in FIG. 4d can be obtained by recessing rotor combs from the top in the third pair and from the bottom in the fourth pair, and recessing stator combs from the top in the fourth pair and from the bottom in the third pair.

The configuration discussed above with reference to FIGS. 4a-4d is just one option. Alternatively, the first measurement capacitor may belong to the first pair and the third pair, the second measurement capacitor may belong to the second pair and the fourth pair, the third measurement capacitor may belong to the first pair and the fourth pair, and the fourth measurement capacitor may belong to the second pair and the third pair.

Another possibility is that the first measurement capacitor may belong to the first pair and the third pair, the second measurement capacitor may belong to the second pair and the third pair, the third measurement capacitor may belong to the first pair and the fourth pair, and the fourth measurement capacitor may belong to the second pair and the fourth pair. Other options are also possible.

Figure 4E:
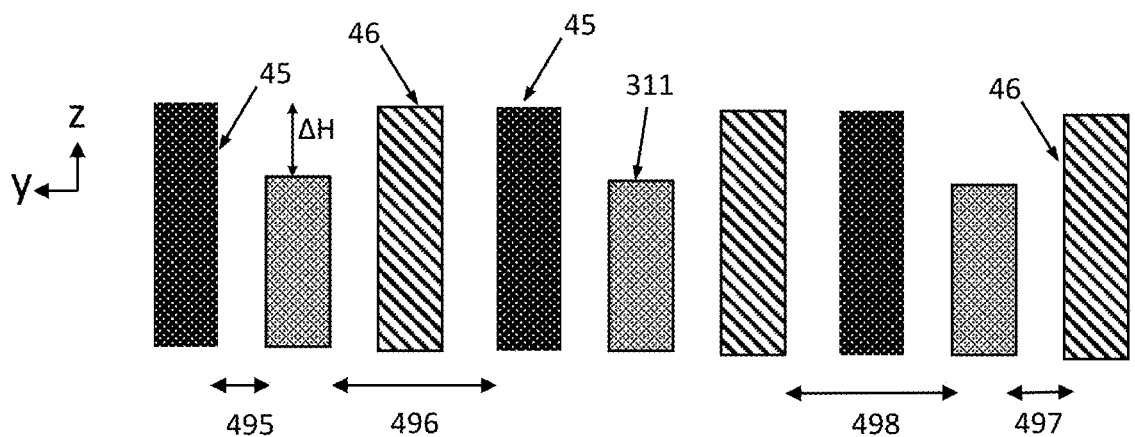
Figure 4E:
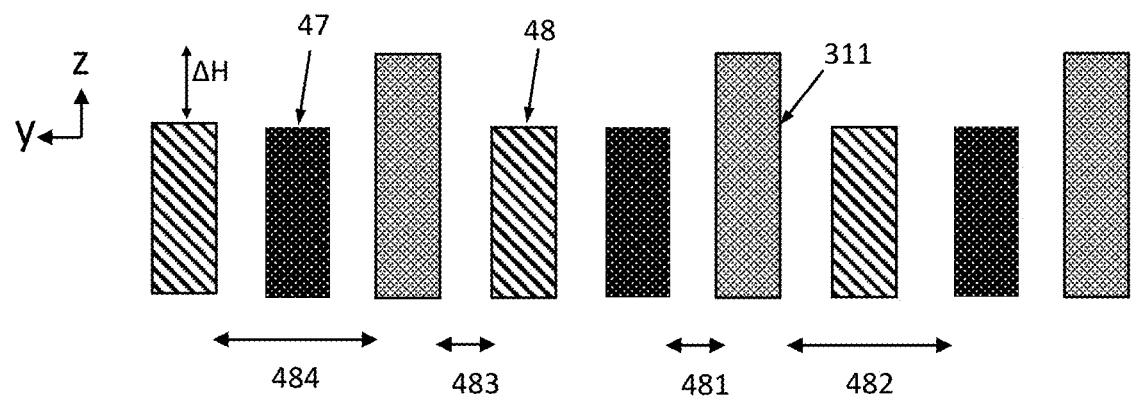
Figure 4F:
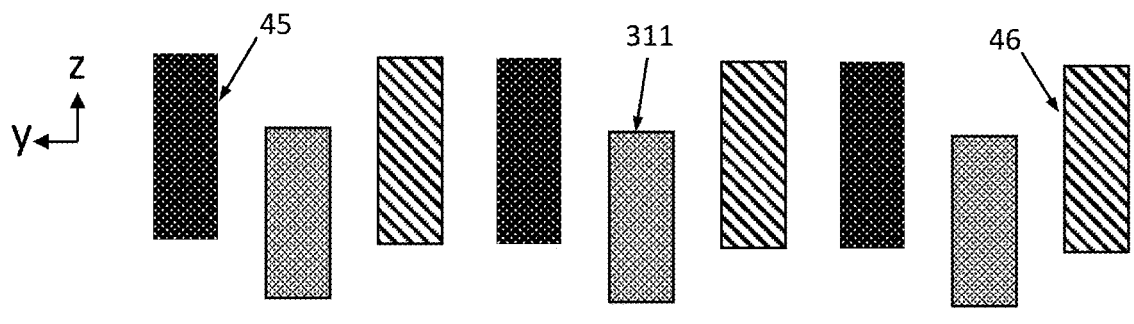
Figure 4F:
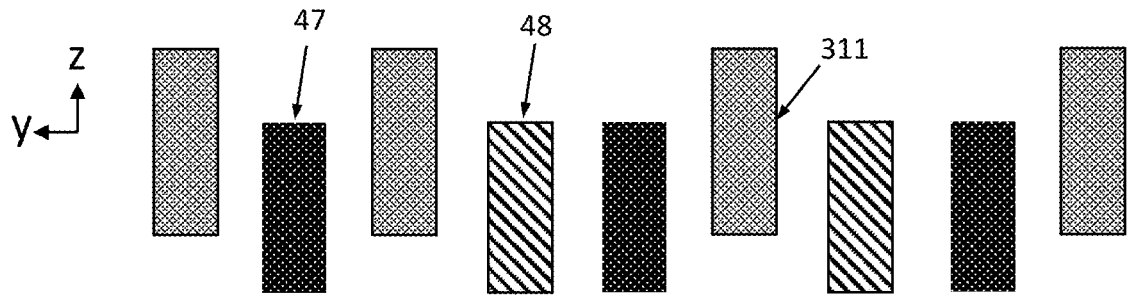

FIGS. 4e and 4f illustrate y-axis interdigitation offset and z-axis alignment offset in an arrangement where the sets of stator combs have been built pairwise in an alternating arrangement, as in FIG. 3c. The figures show comb offsets when the proof mass is in its rest position. Each reference number 45-48 again illustrates a set of stator combs, coloured dark (45, 47) and striped (46, 48). The offset design of two measurement capacitors (for example the ones on the left side of FIG. 3c) is illustrated in subfigure (i), while the offset design of the remaining two measurement capacitors (for example the ones on the right) are illustrated in subfigure (ii).

In the illustrated case, the first measurement capacitor, which is formed between stator combs 45 and the rotor combs 311, belongs to the first pair and the third pair. Any movement of the rotor in the positive y-direction will reduce the gap 495, while movement in the negative y-direction will increase it. There is a positive offset in the first capacitor because 495>496. Furthermore, like other rotor combs in FIG. 4c, each rotor comb 311 in the first measurement capacitor is shielded from the stator comb 45 on the right-hand side by the adjacent comb 46, which belongs to another capacitor. There is also a negative height offset ΔH (from the rotor comb perspective) which creates the same technical effect which was described above with reference to FIGS. 4a and 4c.

The second measurement capacitor (46, 311) belongs to the second pair because the gap 497<498 and to the third pair due to the negative vertical offset ΔH in the rotor combs. Similarly, the third measurement capacitor (47, 311) belongs to the first pair because 481<482 and to the fourth pair because the stator combs 47 have a negative offset ΔH in the z-direction in relation to rotor combs 311. The fourth measurement capacitor (48, 311) belongs to the second pair because 483<484 and to the fourth pair for the same reason as the third capacitor.

FIG. 4f illustrates the capacitors when the single proof mass has rotated about an axis in the device plane. Subfigures (i) and (ii) illustrate combs on opposite sides of this axis. The rotor combs have therefore in (i) moved downward in the first and second measurement capacitors, but upward in the third and fourth measurement capacitors in (ii). Linear translation of the proof mass in the z-direction, where rotor combs move up and down simultaneously in all capacitors, is also possible but has not been illustrated. The same kind of simultaneous up/down movement can be obtained also when two proof masses rotate out of the device plane, as described in more detail in the two-mass examples presented below.

Proof mass movement in the y-direction from the rest position shown in FIG. 4e produces similar displacements in the first and second pairs of measurement capacitors in FIG. 4e as the displacements that were illustrated for separated capacitors in FIG. 4b. The output signals measured from the first and second pairs will have the same dependence on proof mass displacement, and a differential measurement between the first and second pairs again produces an output signal with an approximately linear dependence on displacement in the y-direction. A differential measurement conducted between the third and fourth pairs also yields a signal with an approximately linear dependence between signal amplitude and proof mass displacement in the z-direction.

The configuration illustrated in FIG. 4e is only one alternative for an arrangement where two sets of stator combs are integrated with each other in a comb array. Other arrangements where adjacent stator combs belong to different sets can also be constructed. For example, the negative offsets of the rotor/stator combs in the third and fourth pair could apply to the rotor combs as a whole, so that the bottoms of the rotor and stator combs are also at different vertical levels when the rotor is in its rest position, as FIG. 4*d* illustrates. As discussed with reference to FIG. 4*d*, capacitances will then increase when the proof mass moves in one direction and decrease when it moves in the opposite direction.

Separation of y- and z-Acceleration

One benefit of having comb offsets in both the y- and z-directions is that the same measurement capacitors can be used to measure proof mass displacement both in the y- and z-directions. However, the presentation of the examples above did not address the question that the proof mass can simultaneously undergo movement in both the y- and z-directions if the accelerometer experiences acceleration in both directions. It is clear that the magnitude of y-axis acceleration and that of z-axis acceleration must be determined as two independent variables, even though the measurement capacitors from which these variables are measured are the same.

We may indicate the capacitive signal obtained from the first measurement capacitor by S1, and the signals obtained from the second, third and fourth measurement capacitors by S2, S3 and S4, respectively. Assuming that their division into first, second, third and fourth pairs corresponds to the one which was presented in FIG. 4*a*, it can be shown that a first double-differential signal SS1=(S1+S2)−(S3+S4) exhibits an approximately linear dependence on y-axis displacement but is always zero for z-axis displacement. On the other hand, a second double-differential signal SS2=(S1−S2)−(S3−S4) exhibits an approximately linear dependence on z-axis displacement but is always zero for y-axis displacement. In other words, even though each individual signal S1, S2, S3 and S4 may contain components arising from both y-axis and z-axis displacement, the components arising from one of these displacements will cancel in the double-differential signals. The first double-differential signal will therefore indicate only the magnitude of acceleration in the y-direction, while the second will indicate only the magnitude of acceleration in the z-direction.

It may not always be the best practical solution to measure individual capacitive signals S1-S4 from each capacitor and then to add and subtract them in the digital domain. A better alternative may be to use a measurement arrangement which obtains a first single-differential signal M1=S1−S3 directly from the first and third measurement capacitors and a second single-differential signal M2=S2−S4 from the second and fourth measurement capacitors. The double-differential signals SS1 and SS2 can then be calculated in the digital domain as SS1=M1+M2 and SS2=M1−M2.

The construction of the double-differential signal will depend on how the first, second, third and fourth measurement capacitors are grouped into the first, second, third and fourth pairs. In other words, if the positive and negative offsets in the y- and z-directions are selected in some other way than FIG. 4*a* illustrates, then the individual signal components S1-S4 also have to be put in a different order in the first and second double-differential signals SS1 and SS2 (and in M1 and M2, if two single-differential signals are to be measured directly from the capacitors).

In general, by constructing four separate measurement capacitors, four separate output signals S1-S4, or two separate single-differential output signals M1 and M2, can be obtained. If the offsets between rotor and stator combs in these four measurement capacitors are arranged according to the template presented in this disclosure, it will always be possible to obtain from these output signals two double-differential signals, one of which indicates only the magnitude of y-axis acceleration and the other only the magnitude of z-axis acceleration.

It is also possible to calculate a self-test signal from the four individual output signals S1-S4. For example, in FIG. 4*a*, the self-test signal ST=S1−S2+S3−S4 should always add up to zero, regardless of whether or not the accelerometer undergoes any acceleration. A nonzero value for ST can therefore be interpreted as an indication of possible malfunction. The formula for the self-test signal will depend on how the first, second, third and fourth measurement capacitors are grouped into first, second, third and fourth pairs. In general, in any embodiment in this disclosure the accelerometer may comprise a control unit which calculates a self-test signal. The control unit may be configured to monitor this self-test signal. The control unit may be configured to output an error signal if the self-test signal exceeds a predetermined threshold. This threshold is a value close to zero.

All measurement principles presented in this section apply also to the two-mass examples presented below. The measurement procedure is the same regardless of whether the four measurement capacitors are built around a single proof mass or around two proof masses which are adjacent to each other.

Two-Mass Examples

In the following examples, the one or more proof masses may include a first proof mass and a second proof mass. The first proof mass is suspended from one or more fixed anchor points by a first suspension structure, and the second proof mass is suspended from the one or more fixed anchor points by a second suspension structure. The first proof mass may be coupled to the second proof mass with a coupling structure.

The first and second suspension structures and the coupling structure may allow the first proof mass and the second proof mass to rotate simultaneously out of the device plane in opposite rotational directions about respective rotation axes which extend in the y-direction when the accelerometer undergoes acceleration in the z-direction.

The first and second suspension structures and the coupling structure may alternatively allow the first proof mass and the second proof mass to move simultaneously in linear translation in the z-direction when the accelerometer undergoes acceleration in the z-direction.

The one or more fixed anchor points may comprise a set of first anchor points from which the first proof mass is suspended and a set of second anchor points from which the second proof mass is suspended. Alternatively, the first and second proof masses may be suspended from the same set of anchor points, which may comprise just a single anchor point. This will be illustrated with examples below.

Two kinds of motion may occur in response to acceleration in the y-direction. The first and second suspension structures and the coupling structure may allow the first proof mass and the second proof mass to rotate simultaneously in the xy-plane in opposite rotational directions when the accelerometer undergoes acceleration in the y-direction. Alternatively, the first and second suspension structures and the coupling structure may allow the first proof mass and the second proof mass to move simultaneously in linear translation in the y-direction when the accelerometer undergoes acceleration in the y-direction.

Figure 5A:
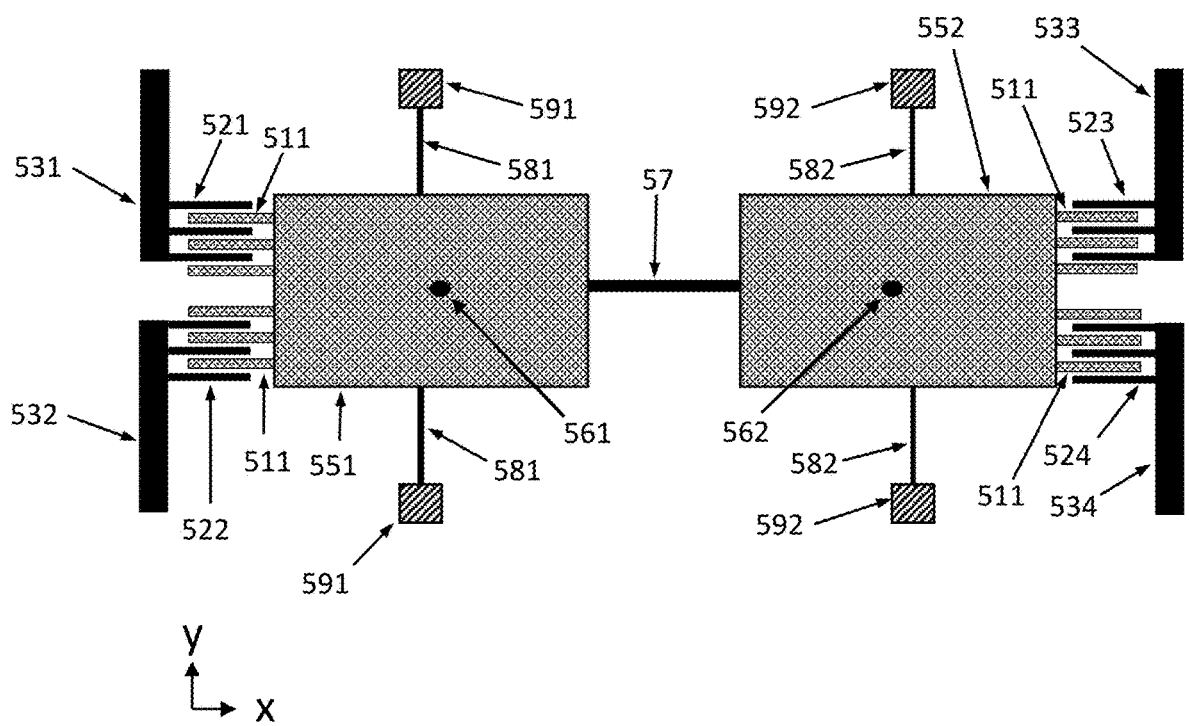
FIGS. 5a-5e illustrate accelerometers with two proof masses according to an exemplary aspect.
Figure 5B:
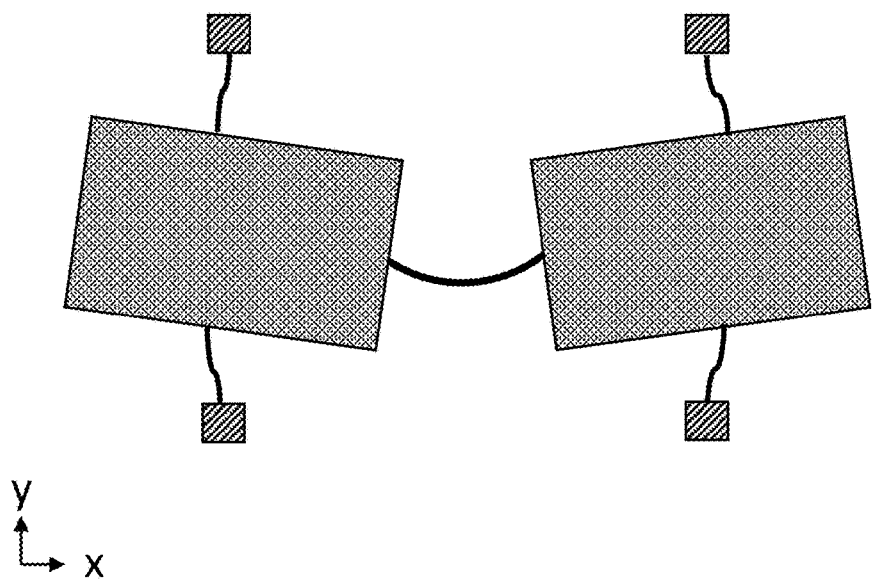
Figure 5C:
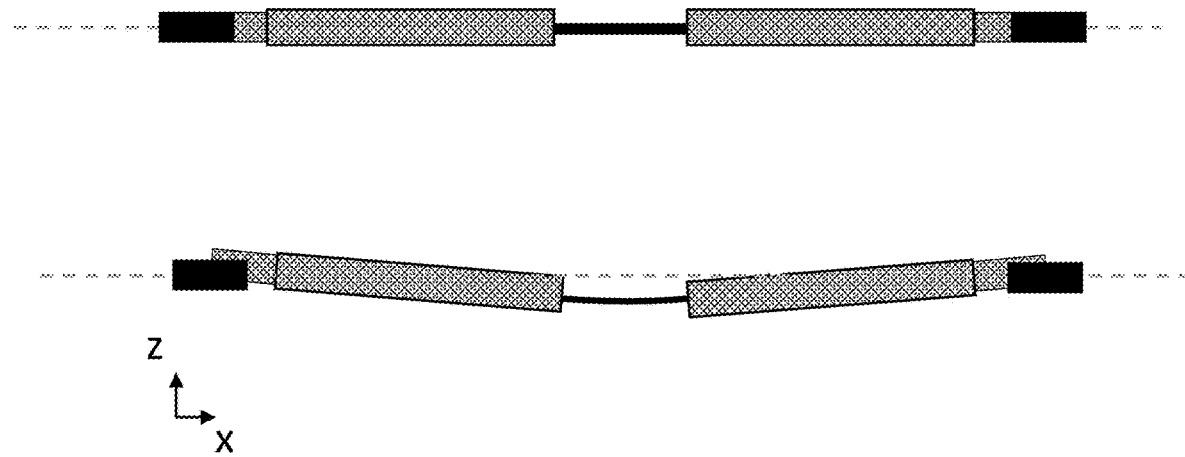

The former alternative is illustrated in FIGS. 5*a*-5*c*, where reference numbers 511, 521-524 and 531-534 correspond to reference numbers 311, 321-324 and 331-334 in FIG. 3*a*.

The four measurement capacitors may be built around the two proof masses 551 and 552 in the same manner that they were built around the one proof mass 31 in FIG. 3a, with two sets of rotor combs 511 on opposite sides (in the x-direction) of the two proof masses 551 and 552. The alternating stator comb alternative illustrated in FIG. 3c may also be implemented on the two proof masses 551 and 552 in exactly the same manner (this has not been separately illustrated). As mentioned above, the measurement principles discussed with reference to FIGS. 4a-4f apply in all two-mass embodiments.

FIG. 5a illustrates a first suspension structure 581 and a second suspension structure 582, first anchor points 591, second anchor points 592 and coupling structure 57.

In FIG. 5a the proof masses 551 and 552 are coupled to each other with a coupling structure 57 which lies between the proof masses. The first suspension structure 581 comprises bars 581 which extend in opposite directions from the first proof mass 551 to first anchor points 591. The second suspension structure comprises bars 582 which extend in opposite directions from the second proof mass 552 to second anchor points 592. The two first anchor points 591 are here located on opposite sides of the first proof mass 551, and the two second anchor points 592 are located on opposite sides of the second proof mass 552.

The bars 581-582 are bendable torsion elements which may be called torsion bars. The location of the first bendable torsion elements 581 defines a first rotation axis, and the location of the second bendable torsion elements 582 defines a second rotation axis. The bendable torsion elements described in this disclosure twist flexibly around the corresponding rotation axis, which allows the masses to rotate about the rotation axes. The anchor points 591 and 592 may lie on the corresponding rotation axes, as FIG. 5a illustrates. Alternatively, the first and second anchor points may be placed some distance away from the rotation axes. The positions of the rotation axes in relation to the anchor points depend on the details of the suspension structure.

FIG. 5a illustrates a device where the center of mass 561 of the first proof mass 551 has a greater x-coordinate than the first rotation axis, and where the center of mass 562 of the second proof mass 552 has a smaller x-coordinate than the second rotation axis.

The proof masses, the suspension structures and the coupling structure are illustrated in their rest positions in FIG. 5a. FIG. 5b illustrates schematically the movement of the proof masses when the accelerometer undergoes acceleration in the positive y-direction. Because the center of mass of each proof mass 551/552 does not lie on the corresponding rotation axis, each proof mass will impart a torque on the corresponding suspension structure. If the suspension structures are sufficiently flexible, the proof masses will rotate in the device plane as FIG. 5b illustrates. This rotation will be anti-phase rotation due to the way that the centers of mass 561 and 562 are placed in relation to the rotation axes. In other words, the first and second proof mass rotate in opposite directions in the device plane.

FIG. 5c illustrates schematically the movement of the proof masses when the accelerometer undergoes acceleration in the positive z-direction. The positions of the centers of mass 561 and 562 in relation to the rotation axes produces anti-phase out-of-plane rotation. In other words, the first and second proof masses rotate in opposite directions.

Figure 5D:
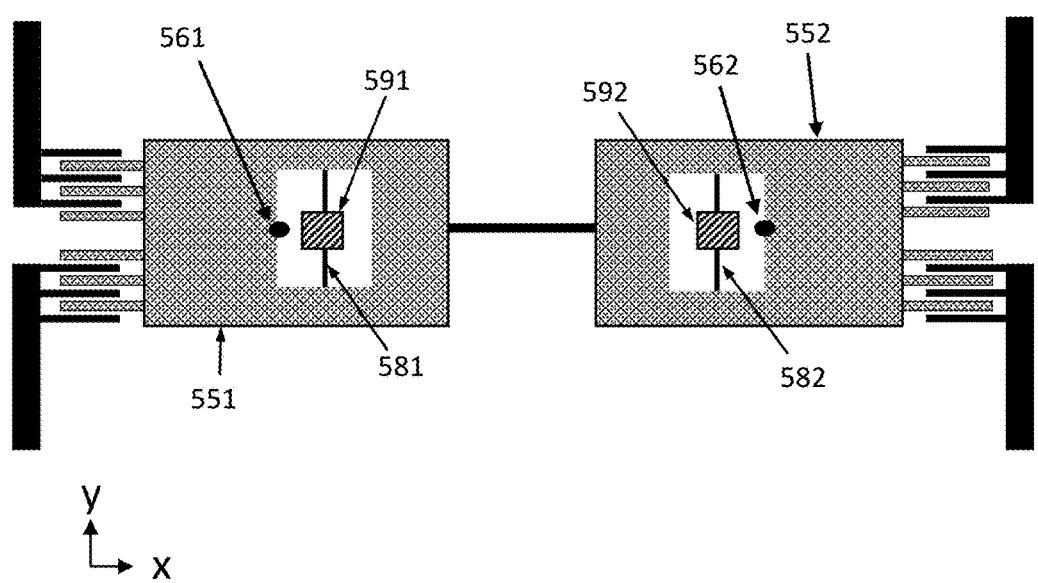

FIG. 5d illustrates a different suspension structure where the bars 581 which form bendable torsion elements in the first suspension structure are attached to the same first anchor point 591, and this first anchor point lies within an opening in the first proof mass 551. The same arrangement is used in the second suspension structure. There could alternatively be two separate first/second anchor points within the opening in each proof mass.

The first suspension structure 581 comprises bendable torsion elements 581 which extend in opposite directions from the first proof mass 551 to first anchor point 591. The second suspension structure comprises bendable torsion elements 582 which extend in opposite directions from the second proof mass 552 to second anchor point 592.

FIG. 5d also illustrates a device where the center of mass 561 of the first proof mass 551 lies to the left of the first rotation axis, and the center of mass 562 of the second proof mass 552 lies to the right of the second rotation axis. The placement of the center of mass is not linked to the details of the suspension structure—the center of mass geometry illustrated in FIG. 5a could also be implemented in FIG. 5d, and vice versa. The direction of rotation in response to acceleration in the y- or z-direction becomes the opposite when the center of mass is switched to the other side of the axis. As long as the same switch is performed in both proof masses, the proof masses will rotate in anti-phase in response to y- and z-acceleration.

In other words, when the centers of mass are arranged in the manner which FIG. 5d illustrates, each proof mass will rotate in directions which are opposite to the rotation directions illustrated in FIGS. 5b and 5c. The first and the second proof mass will still rotate in anti-phase.

FIGS. 5a and 5d illustrate proof masses which are asymmetric in the xy-plane with respect to the corresponding rotation axes. However, the proof masses could alternatively be symmetric in the xy-plane with respect to the horizontal axes, and one or more regions on each proof mass could be made thinner in the z-direction than the rest of the proof mass. If these one or more regions are asymmetric with respect to the rotation axis, the center of mass of the proof mass will be shifted away from the rotation axis.

In other words, the first proof mass may be asymmetric in the xy-plane with respect to the first rotation axis, and the second proof mass may be asymmetric in the xy-plane with respect to the second rotation axis. Alternatively or complementarily, in any embodiment in this disclosure where a proof mass is illustrated as being either symmetric or asymmetric with respect to the rotation axis in the xy-plane, the first proof mass may comprise a first thinned region which is asymmetric with respect to the first rotation axis, and the second proof mass may comprise a second thinned region which is asymmetric with respect to the second rotation axis.

A thinned region can be implemented even in a proof mass which is asymmetric with respect to the rotation axis. In other words, the proof mass can be either asymmetric or symmetric with respect to the rotation axis in the xy-plane and comprise one or more regions which are thinner in the z-direction than the rest of the proof mass. If the proof mass is symmetric, these regions must be placed asymmetrically with respect to the rotation axis.

Figure 5E:
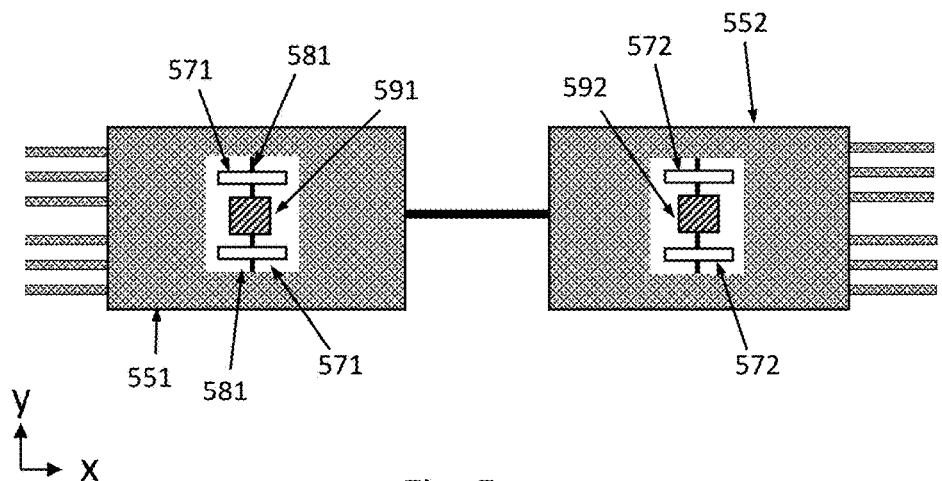

FIG. 5e illustrates a device where the first and second suspension structures comprise springs 571-572 which are flexible in the y-direction. These springs facilitate linear translation in the y-direction when the accelerometer undergoes acceleration in this direction.

Figure 6A:
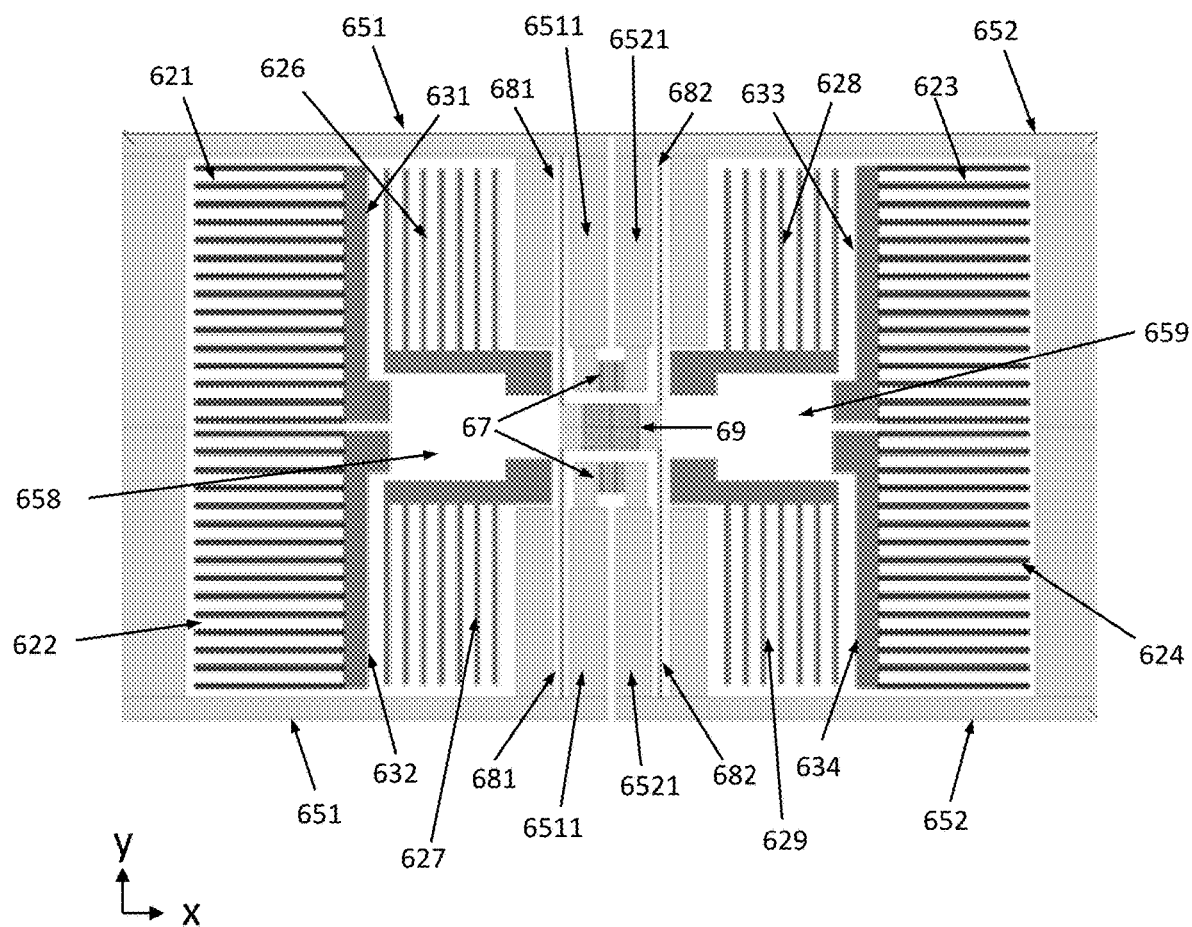
FIGS. 6a-6b also illustrate accelerometers with two proof masses according to an exemplary aspect.

FIG. 6a illustrates an accelerometer which corresponds to some extent to FIGS. 5a and 5d. Reference numbers 621-624, 631-634, 651-652 and 67 correspond to reference numbers 521-524, 531-534, 551-552 and 57, respectively, in FIG. 5a and to the corresponding elements in FIG. 5b. The placement of the centers of mass of proof masses 651-652 with respect to the rotation axes corresponds in FIG. 6a to FIG. 5d, but the centers of mass could alternatively be placed as in FIG. 5a. The mass movement described with reference to FIGS. 5a-5c applies to 6a also.

In FIG. 6a the first and second proof masses 651 and 652 comprise openings 658 and 659, respectively. The accelerometer in FIG. 6a differs from the ones in FIGS. 5a and 5d in that the first and second sets of stator combs 621-622 are located within the opening 658 in the first proof mass 651, while the third and fourth sets of stator combs 623-624 are located within the opening 659 in the second proof mass 652. The fixed structures 631-634, which are electrically separated from each other, are also located within said openings.

Rotor combs have been omitted from FIG. 6a for clarity, but each set of stator combs 621-622 within the first proof mass 651 is interdigitated with rotor combs on the first proof mass 651, and each set of stator combs 623-624 within the second proof mass 652 is interdigitated with rotor combs on the second proof mass 652. All options which were presented and discussed in the one-mass example relating to offsets and the measurement of mass displacement in the y- and z-directions are applicable also in the accelerometer shown in FIG. 6a (and the one in 6b, see below).

In the accelerometer in FIG. 6a the first and second proof masses 651-652 are suspended from a single anchor point 69. This anchor point is located between the proof masses 651 and 652. The first suspension structure comprises two bendable torsion elements 681 which extend from the anchor point 69 to the first proof mass 651 in opposite y-directions. The second suspension structure comprises two bendable torsion elements 682 which extend from the anchor point 69 to the second proof mass 652 in opposite y-directions.

Furthermore, in FIG. 6a the coupling structure between the first and second proof masses comprises two coupling springs 67 placed on opposite sides (in the y-direction) of the anchor point 69. First proof mass 651 comprises on both sides of the anchor point 69 first edge parts 6511 which lie between (in the x-direction) the first bendable torsion elements 681 and the gap between the first proof mass 651 and the second proof mass 652. Correspondingly, the second proof mass 652 comprises on both sides of the anchor point 69 second edge parts 6521 which lie between (in the x-direction) the second bendable torsion elements 682 and the gap between the first proof mass 651 and the second proof mass 652.

The ends of the first and second edge parts 6511 and 6521 are attached to each other with coupling springs 67. These coupling springs may be flexible both for in-plane bending and out-of-plane bending. This facilitates the proof mass movements illustrated in FIGS. 5b and 5c. The bendable torsion elements 681-682 are torsionally flexible to allow the out-of-plane rotation shown in FIG. 5c. They may also bend in the device plane to allow the in-plane rotation shown in FIG. 5b.

The bendable torsion elements 681-682 may be flexible in the x-direction to allow simultaneous movement of the first and second proof masses 651-652 in the x-direction. The coupling springs 67 may be quite stiff in the x-direction to synchronize the movement of the first and second proof masses 651 and 652 in the x-direction so that the masses move left and right substantially in the same phase.

The first and second edge parts 6511 and 6512 may extend close to the anchor point 69 as FIG. 6a illustrates, but they cannot be attached to the anchor point. The flexibility of the proof mass system to the in-plane rotation shown in FIG. 5b depends both on the properties of the coupling springs 67 and on the distances from the rotation axes of the proof masses to the coupling springs 67. The flexibility of the bendable torsion elements 681-682 also influences this in-plane rotation.

Figure 6B:
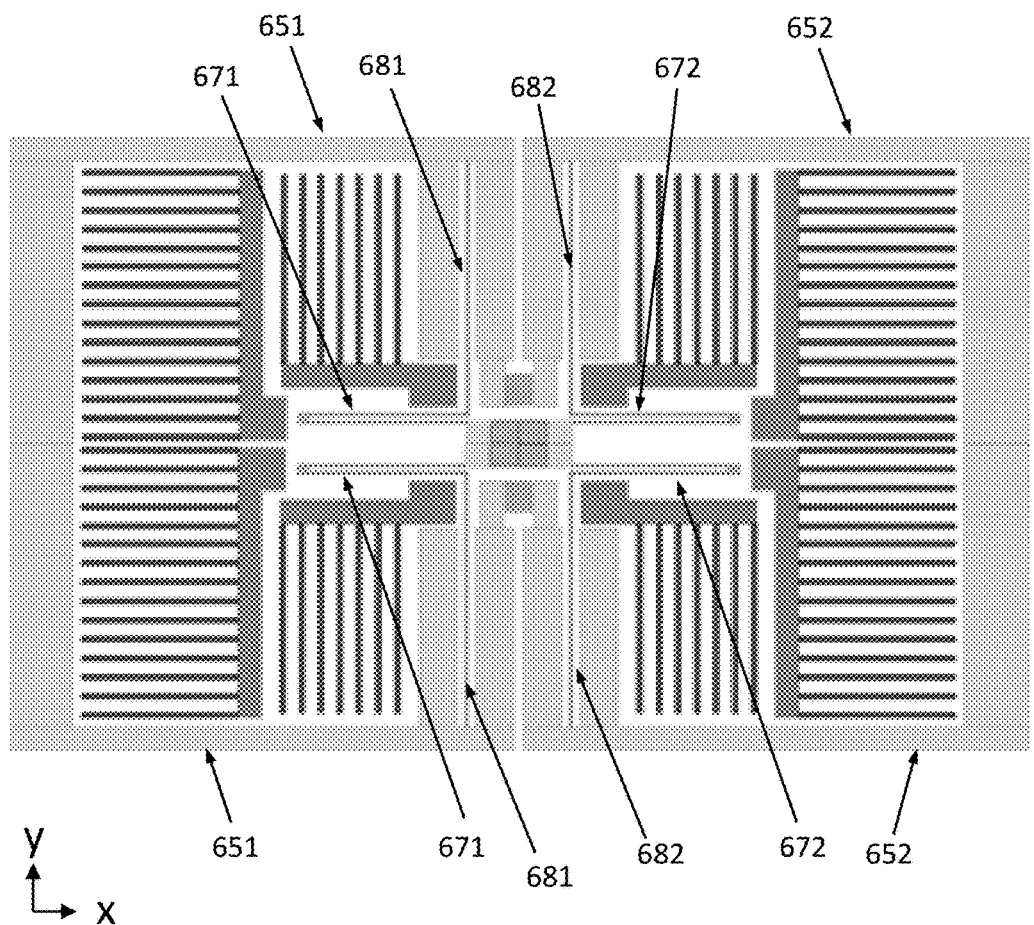

FIG. 6b shows an accelerometer which comprises the same features as the one in FIG. 6a. The first and second suspension structures also comprise additional springs 671 and 672 which correspond to reference numbers 571 and 572, respectively, in FIG. 5e. The additional springs 671 and 672 may be concatenated with the bendable torsion elements 681 and 682 in each suspension structure, as FIG. 6b illustrates. The additional springs 671 and 672 are flexible in the y-direction, so they facilitate simultaneous linear translation of proof masses 651 and 652 in the y-direction. The benefit of this arrangement is that coupling springs 67 do not have to be flexible for in-plane rotation (FIG. 5b) when the two proof masses are configured to undergo linear motion in the y-direction.

In any embodiment presented in this disclosure (including the one-mass embodiments), the one or more proof masses may also comprise additional rotor combs which extend in the y-direction, and the accelerometer may comprise four fixed sets of additional stator combs which extend in the y-direction. The sets of additional stator combs 626-629 have been illustrated in FIGS. 6a and 6b. The additional rotor combs have been omitted for clarity.

Each of the four fixed sets of additional stator combs 626-629 is electrically insulated from the other three of the four sets of additional stator combs and from the four sets 621-624 of stator combs. Each set of additional stator combs 626-629 is interdigitated with additional rotor combs, so that the four sets of additional stator combs 626-629 form a set of four additional measurement capacitors together with the additional rotor combs.

As mentioned above, the one or more proof masses may be mobile in the x-direction in relation to said fixed sets of additional stator combs. The four additional measurement capacitors may measure mass movement at least in the x-direction. Furthermore, the four additional measurement capacitors may comprise comb offsets in the four additional measurement capacitors designed according to the principles that were discussed above with reference to the four measurement capacitors which measure movement in the y-direction.

In other words, the set of four additional measurement capacitors may comprise a first additional pair and a second additional pair, so that each of the four additional measurement capacitors belongs to either the first additional pair or the second additional pair.

The position of additional stator combs may have a negative offset in the x-direction in relation to the additional rotor combs in the first additional pair when the one or more proof masses are in their rest position, so that capacitances increase in the first additional pair when the one or more proof masses move away from the rest position in a positive x-direction and decrease when the one or more proof masses move away from the rest position in a negative x-direction.

The position of additional rotor combs may have a negative offset in the x-direction in relation to additional stator combs in the second additional pair when the one or more proof masses are in their rest position, so that capacitances decrease in the second additional pair when the one or more proof masses move away from the rest position in a positive x-direction and increase when the one or more proof masses move away from the rest position in a negative x-direction.

An additional option is that the four additional measurement capacitors may also be used for measuring mass movement in the z-direction by arranging comb offsets in the four additional measurement capacitors in the z-direction according to the principles that were discussed above with reference to the four measurement capacitors which also measure movement in the z-direction.

In other words, the set of four additional measurement capacitors may also comprise a third additional pair and a fourth additional pair, so that each of the four additional measurement capacitors belongs to either the third additional pair or the fourth additional pair.

The position of additional rotor combs may have a negative offset in the z-direction in relation to additional stator combs in the third additional pair when the one or more proof masses are in their rest position, so that capacitances decrease in the third additional pair when the one or more proof masses move away from the rest position in a negative z-direction and increase or remain constant when the one or more proof masses move away from the rest position in a positive z-direction.

The position of additional stator combs may have a negative offset in the z-direction in relation to additional rotor combs in the fourth additional pair when the one or more proof masses are in their rest position, so that capacitances decrease in the fourth additional pair when the one or more proof masses move away from the rest position in a positive z-direction, and increase or remain constant when the one or more proof masses move away from the rest position in a negative z-direction.

Differential measurement signals can be measured from the additional measurement capacitors. The discussion given in the section "Separation of y- and z-acceleration" above applies also to the separation of x- and z-acceleration in the differential signals measured from the additional measurement capacitors. The double-differential signal obtained for z-axis displacement from the four additional measurement capacitors can be added to corresponding signal (SS2 in the aforementioned section) obtained from the four measurement capacitors. Furthermore, the x-axis measurement can be incorporated with the y- and z-axis measurements in the self-test signal, so that an error in any of these measurements yields a nonzero value in the self-test signal.

However, the accelerometers in FIGS. 6a-6b can be utilized even without any comb offsets in the x, y- or z-direction. These accelerometers may contain the following features (regardless of whether or not comb offsets are implemented):

An accelerometer for measuring acceleration in the direction of at least of two of the following axes: an x-axis, a y-axis and a z-axis. The x, y and z-axes are perpendicular to each other, and the accelerometer comprises a first proof mass 651 and a second proof mass 652.

The first and second proof masses 651 and 652 are adjacent to each other and at least partly aligned with each other on the x-axis.

The first and second proof masses 651 and 652 are coupled to each other with a coupling structure which extends from the first proof mass to the second proof mass.

The first and second proof masses 651 and 652 lie in the xy-plane in their rest position.

The first proof mass 651 is suspended from one or more central anchor points 69 by a first suspension structure which allows the first proof mass 651 to undergo linear translation along the x-axis, rotation about a first vertical axis in the xy-plane and rotation about a first horizontal axis out of the xy-plane. The first vertical axis is perpendicular to the xy-plane and the first horizontal axis is parallel to the y-axis.

The second proof mass 652 is suspended from the one or more central anchor points by a second suspension structure which allows the second proof mass 652 to undergo linear translation along the x-axis, rotation about a second vertical axis in the xy-plane and rotation about a second horizontal axis out of the xy-plane, wherein the second vertical axis is perpendicular to the xy-plane and the second horizontal axis is parallel to the y-axis.

Either the x-coordinate of the center of mass of the first proof mass 651 is greater than the x-coordinate of the first horizontal axis and the x-coordinate of the center of mass of the second proof mass 652 is less than the x-coordinate of the second horizontal axis, or the x-coordinate of the center of mass of the first proof mass 651 is less than the x-coordinate of the first horizontal axis and the x-coordinate of the center of mass of the second proof mass 652 is greater than the x-coordinate of the second horizontal axis.

The coupling structure synchronizes the movement of the first 651 and second 652 proof masses so that the first and second proof masses are linearly displaced from their rest position in the same direction parallel to the x-axis when the accelerometer undergoes acceleration in the direction of the x-axis, The coupling structure synchronizes the movement of the first 651 and second 652 proof masses so that the first proof mass 651 is rotationally displaced from its rest position in the xy-plane about the first vertical rotation axis in a first in-plane rotational direction when the accelerometer undergoes acceleration in the direction of the y-axis, and the second proof mass 652 is rotationally displaced from its rest position in the xy-plane about the second vertical rotation axis in a second in-plane rotational direction when the accelerometer undergoes acceleration in the direction of the y-axis, wherein the first in-plane rotational direction is opposite to the second in-plane rotational direction.

The coupling structure synchronizes the movement of the first 651 and second 652 proof masses so that the first proof mass 651 is rotationally displaced from its rest position out of the xy-plane about the first horizontal axis in a first out-of-plane rotational direction when the accelerometer undergoes acceleration in the direction of the z-axis, and the second proof mass 652 is rotationally displaced from its rest position out of the xy-plane about the second horizontal axis in a second out-of-plane rotational direction when the accelerometer undergoes acceleration in the direction of the z-axis, wherein the first out-of-plane rotational direction is opposite to the second out-of-plane rotational direction.

The coupling structure comprises a first coupling spring 67 on a first side of the central anchor point 69, and the coupling structure also comprises a second coupling spring 67 on a second side of the central anchor point 69, wherein the first and second sides of the central anchor point 69 are opposite to each other in the y-direction.

The first suspension structure comprises a first bendable torsion element 681 and a second bendable torsion element 681 which extend in opposite y-directions from the one or more central anchor points 69 to the first proof mass 651, and the second suspension structure comprises a third bendable torsion element 682 and a fourth bendable torsion element 682 which extend in opposite y-directions from the one or more second anchor points 69 to the second proof mass 652.

The first horizontal axis is the axis determined by the first bendable torsion elements 681. The second horizontal axis is the axis determined by the second bendable torsion elements 682. The vertical axes about which the in-plane rotations occur are located somewhere close to the geometric center of the proof masses. Their positions depend on the positions of the centers of mass of the first and second proof masses and on the bending properties of the bendable torsion elements.

Figure 7A:
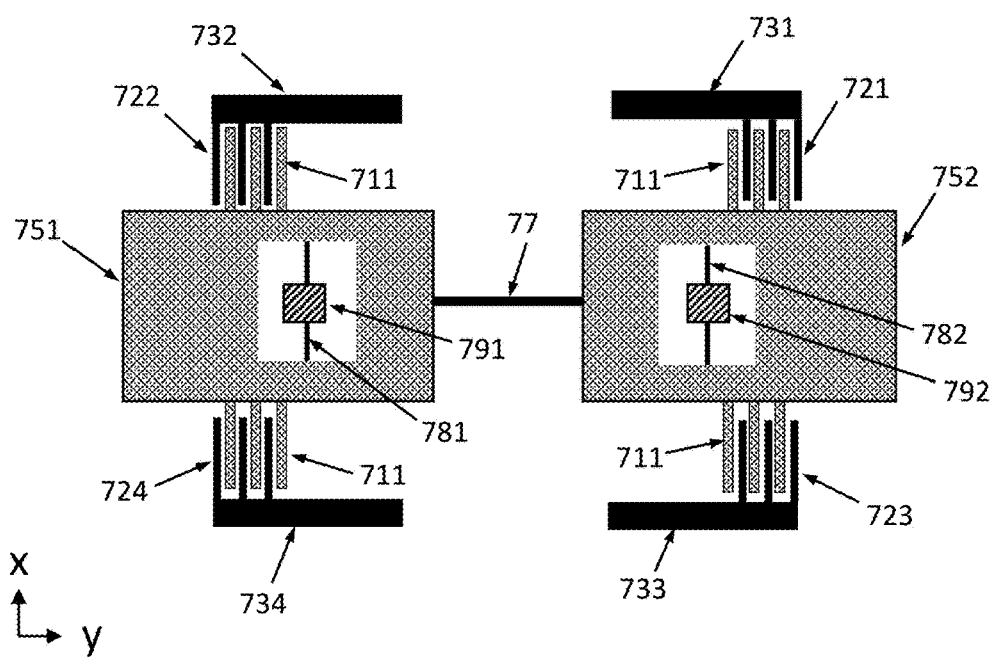
FIGS. 7a-7c also illustrate accelerometers with two proof masses according to an exemplary aspect.

FIG. 7a illustrates another two-mass example. Reference numbers 711, 721-724, 731-734, 751-752, 77, 781-782, 791-792 correspond to reference numbers 511, 521-524, 531-534, 551-552, 57, 581-582, 591-592, respectively, in FIGS. 5a and 5d. But FIG. 7a differs from 5a and 5d in that the x- and y-axes have switched places. Just as before, the four sets of stator combs 721-724 extend in the x-direction, as do the rotor combs 711. However, unlike FIGS. 5a and 5d, in FIG. 7a the rotation axes determined by the bendable torsion elements 781-782 are oriented in the x-direction.

In this device the one or more proof masses consist of a first proof mass 751 and a second proof mass 752. The first proof mass 751 is suspended from one or more anchor points 791-792 by a first suspension structure 781. The second proof mass 752 is suspended from the one or more anchor points 791-792 by a second suspension structure 782. The first proof mass 751 is coupled to the second proof mass 752 with a coupling structure 77.

The first and second suspension structures 781-782 and the coupling structure 77 allow the first proof mass 751 and the second proof mass 752 to move in linear translation in the y-direction when the accelerometer undergoes acceleration in the y-direction. The first and second suspension structures 781-782 and the coupling structure 77 allow the first proof mass 751 and the second proof mass 752 to rotate simultaneously out of the device plane in opposite rotational directions about respective rotation axes which extend in the x-direction when the accelerometer undergoes acceleration in the z-direction.

The device illustrated in FIG. 7a is equivalent to the device shown in FIG. 6a if the sets of stator combs 626-629 which extend in the y-direction in FIG. 6a would be used as the four sets of stator combs, not as four additional sets of stator combs as they were introduced in FIG. 6a. In other words, as FIG. 7a illustrates, when offsets between rotor and stator combs are arranged in the manner described above, the sets of stator combs 721-724 can be used to measure the movement of the two proof masses 751-752 both in the out-of-plane z-direction and in the in-plane direction (y in FIG. 7a, x in FIG. 6a) which is perpendicular to the out-of-plane rotation axes of the first and second proof masses.

Figure 7B:
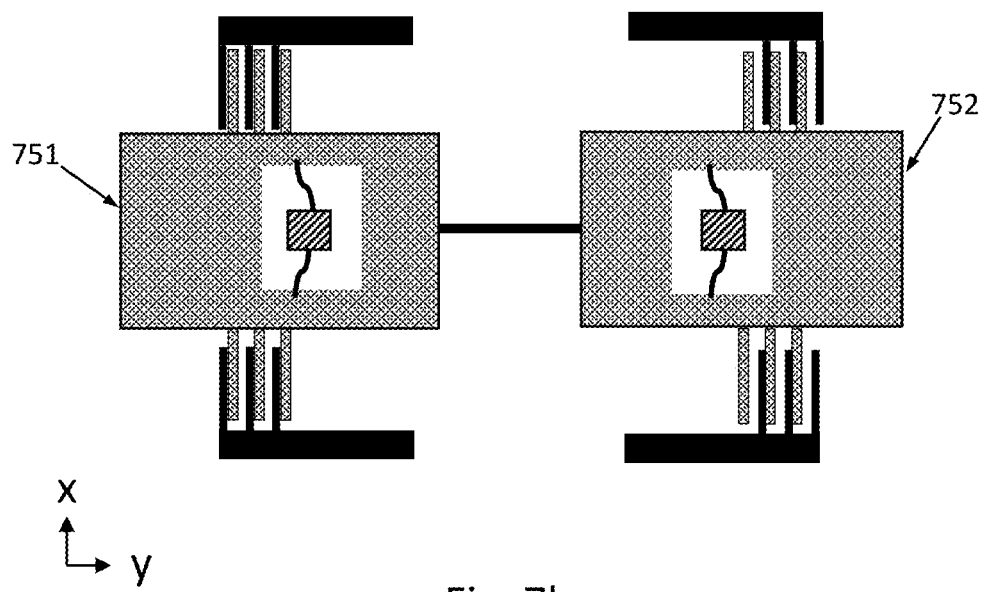
Figure 7C:
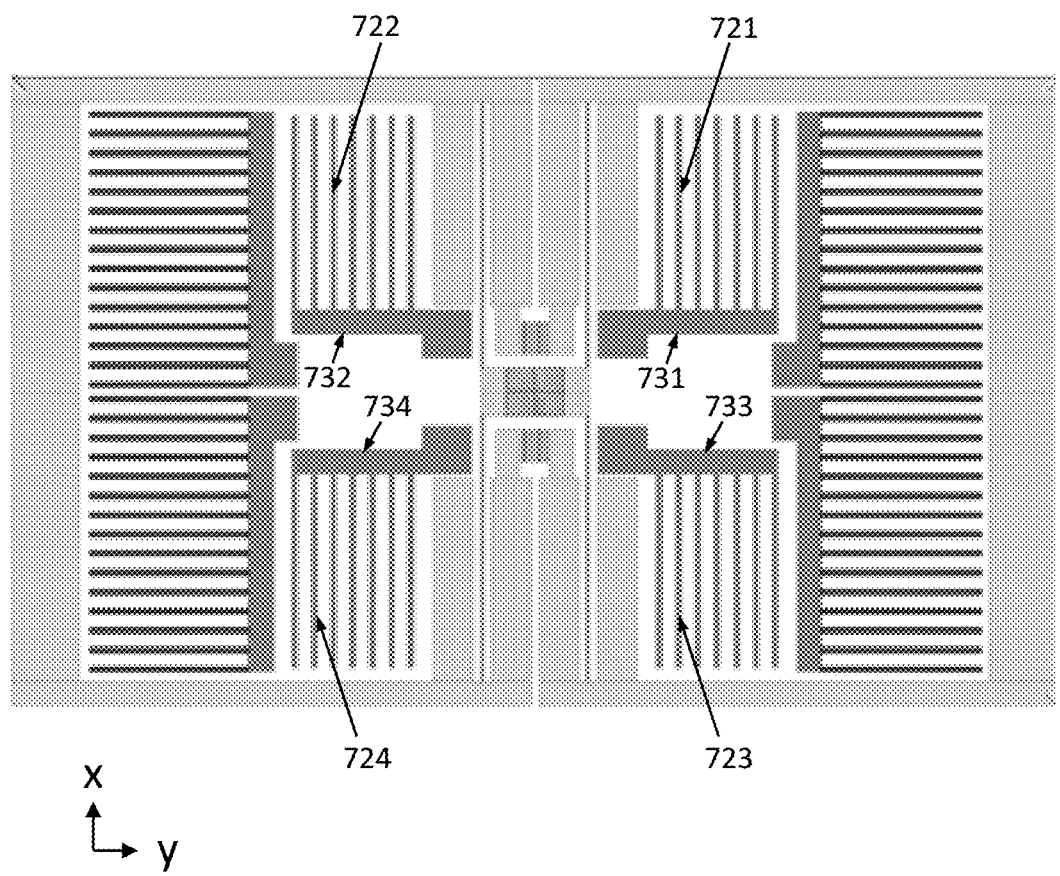

FIG. 7a illustrates the proof masses in their rest position. FIG. 7b illustrates schematically how the bendable torsion elements may bend when the first and second proof masses move away from their rest position in the y-direction. Both proof masses could alternatively be suspended from the same central anchor point, as in FIG. 6a. This is illustrated in FIG. 7c where the proof mass arrangement is the same as in FIG. 6a.

Additional Exemplary Aspects

In the one-mass and two-mass examples presented above, the four measurement capacitors were configured to measure acceleration both in the y-direction and in the z-direction. The four capacitors (corresponding to stator combs 626-629) which were configured to measure acceleration in the x-direction in FIG. 6a were labelled additional measurement capacitors. However, the measurement principle discussed above can be implemented also with two capacitors which are configured to measure acceleration in the x-direction and two which are configured to measure acceleration in the y-direction. All four of these capacitors are also configured to measure acceleration in the z-direction. This option will be illustrated with two proof masses, but the same measurement principle with only one proof mass.

In general, in this example the accelerometer comprises one or more proof masses in a device layer. The device layer defines an xy-plane and a z-direction which is perpendicular to the xy-plane. The one or more proof masses comprise a first set of rotor combs which extend in the x-direction and a second set of rotor combs which extend in the y-direction.

The accelerometer also comprises a first set of stator combs and a second set of stator combs which extend in the x-direction. The first set of stator combs is electrically insulated from the second set of stator combs. The first and second sets of stator combs are interdigitated with the first set of rotor combs, so that the first and second sets of stator combs form a first and a second measurement capacitor, respectively, together with the first set of rotor combs.

The accelerometer also comprises a third set of stator combs and a fourth set of stator combs which extend in the y-direction. The third set of stator combs is electrically insulated from the first, second and fourth sets of stator combs. The fourth set of stator combs is electrically insulated from the first and second sets of stator combs. The third and fourth sets of stator combs are interdigitated with the second set of rotor combs, so that the third and fourth sets of stator combs form a third and a fourth measurement capacitor, respectively, together with the second set of rotor combs.

The one or more proof masses are mobile in the x-direction, the y-direction and the z-direction in relation to the first, second, third and fourth sets of stator combs.

The position of the rotor combs has a positive offset in the y-direction in relation to stator combs in the first measurement capacitor when the one or more proof masses are in their rest position, so that capacitance increases in the first measurement capacitor when the one or more proof masses move away from the rest position in a positive y-direction and decreases when the one or more proof masses move away from the rest position in a negative y-direction.

The position of the rotor combs has a negative offset in the y-direction in relation to stator combs in the second measurement capacitor when the one or more proof masses are in their rest position, so that capacitance decreases in the second measurement capacitor when the one or more proof masses move away from the rest position in the positive y-direction and increases when the one or more proof masses move away from the rest position in the negative y-direction.

The position of the rotor combs has a positive offset in the x-direction in relation to stator combs in the third measurement capacitor when the one or more proof masses are in their rest position, so that capacitance increases in the third measurement capacitor when the one or more proof masses move away from the rest position in a positive x-direction and decreases when the one or more proof masses move away from the rest position in a negative x-direction.

The position of the rotor combs has a negative offset in the x-direction in relation to stator combs in the fourth measurement capacitor when the one or more proof masses are in their rest position, so that capacitance decreases in the fourth measurement capacitor when the one or more proof masses move away from the rest position in the positive x-direction and increases when the one or more proof masses move away from the rest position in the negative x-direction.

The first, second, third and fourth measurement capacitors comprise a first pair and a second pair, so that each of the first, second, third and fourth measurement capacitors belongs to either the first pair or the second pair.

The position of the rotor combs has a negative offset in the z-direction in relation to stator combs in the first pair when the one or more proof masses are in their rest position, so that capacitances decrease in the first pair when the one or more proof masses move away from the rest position in a negative z-direction, and increase or remain constant when the one or more proof masses move away from their rest position in a positive z-direction.

The position of the stator combs has a negative offset in the z-direction in relation to rotor combs in the second pair when the one or more proof masses are in their rest position, so that capacitances decrease in the second pair when the one or more proof masses move away from the rest position in a positive z-direction, and increase or remain constant when the one or more proof masses move away from their rest position in a negative z-direction.

Figure 8A:
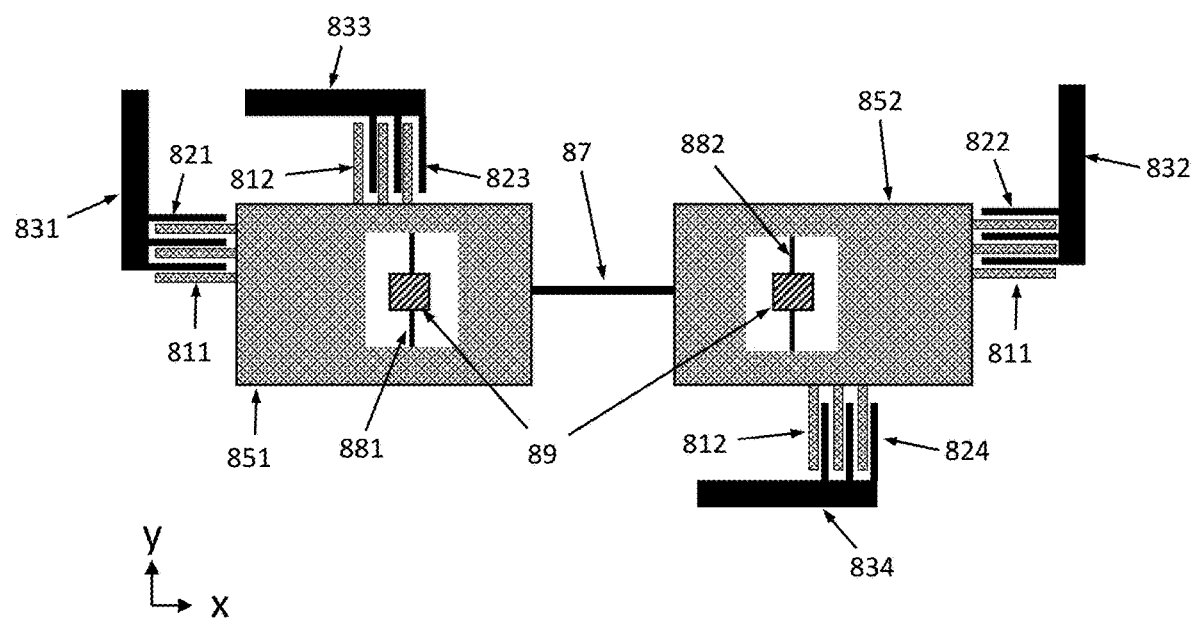
FIGS. 8a-8d illustrate a further exemplary aspect.

FIG. 8a illustrates an accelerometer according to this example. It comprises a first proof mass 851 and a second proof mass 852. All options and operating principles that were presented in the two-mass examples above relating to the suspension and movement of a first and a second proof masses apply also in this case. Consequently, the first proof mass 851 may be suspended from one or more anchor points 89 by a first suspension structure 881, and the second proof mass 852 may be suspended from one or more anchor points by a second suspension structure 882, as in the earlier two-mass examples. The first proof mass 851 may also be coupled to the second proof mass 852 with a coupling structure 87. The first and second suspension structures 881-882 and the coupling structure 87 may allow the first proof mass 851 and the second proof mass 852 to rotate simultaneously out of the device plane in opposite rotational directions about respective rotation axes, which extend in the y-direction, when the accelerometer undergoes acceleration in the z-direction. The first and second suspension structures and the coupling structure may also allow the first proof mass 851 and the second proof mass 852 to rotate simultaneously in the xy-plane in opposite rotational directions when the accelerometer undergoes acceleration in the y-direction. The first and second suspension structures and the coupling structure may also allow the first proof mass 851 and the second proof mass 852 to move together in linear translation in the x-direction when the accelerometer undergoes acceleration in the x-direction.

Figure 8B:
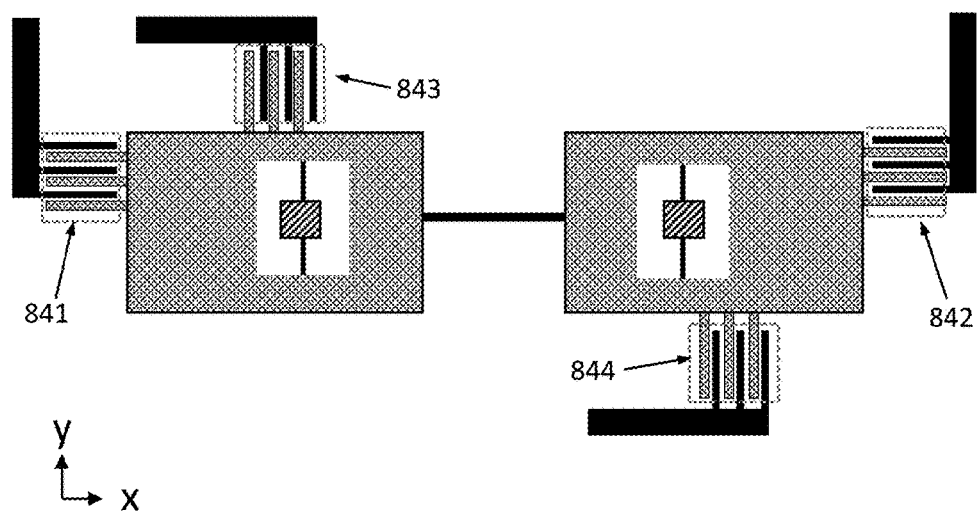

The accelerometer comprises a first set of rotor combs 811 and a second set of rotor combs 812. The first set of stator combs is 821 (protruding from first fixed structure 831 toward the first proof mass 851) and the second set of stator combs is 822. These two sets of stator combs form a first measurement capacitor 841 and a second measurement capacitor 842 with the first set of rotor combs 811, as FIG. 8b illustrates. The third set of stator combs is 823 (protruding from third fixed structure 833 toward the first proof mass 851) and the fourth set of stator combs is 824. These two sets of stator combs form a third measurement capacitor 843 and a fourth measurement capacitor 844 with the second set of rotor combs 812.

The offsets of the four measurement capacitors 841-844 were explained above. A differential measurement performed between the first and second measurement capacitors 841-842 yields an output signal with a linear dependence on proof mass displacement in the y-direction, as explained in the earlier example. A differential measurement between 843 and 844 yields a signal with a linear dependence on displacement in the x-direction.

In this example the set of four measurement capacitors has already been divided once when 841 and 842 were placed adjacent to the proof masses 851-852 in the x-direction and 843 and 844 were placed adjacent to the proof masses in the y-direction. They are now also divided into a first pair and a second pair with regard to z-axis offsets.

The first (841) and second (842) measurement capacitors may form the first pair, which has a negative rotor offset in the z-direction, and the third (843) and fourth (844) measurement capacitors may form the second pair, which has a negative stator offset in the z-direction. Alternatively, the first and third measurement capacitors may form the first pair and the second and fourth measurement capacitors may form the second pair. Any two measurement capacitors 841-844 can be paired in the first pair, and the remaining two capacitors will then form the third pair.

Figure 8C:
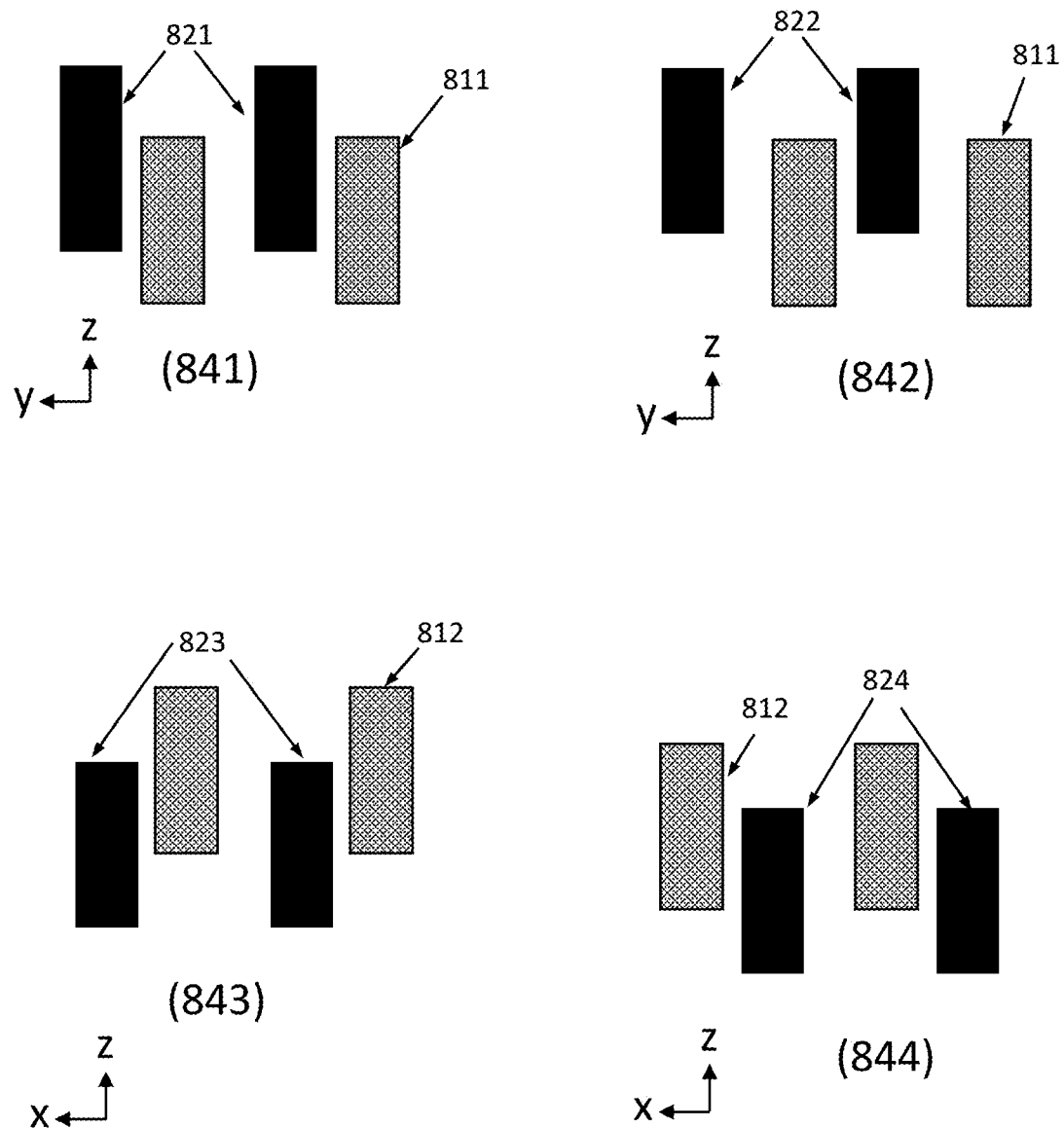

FIG. 8c illustrates the option where the first pair is 841+842 and the second pair is 843+844. In this illustration, the offsets in the z-direction have been implemented on both the top and bottom sides of the rotor and stator combs, so that there is a height difference on both sides. The capacitances will therefore decrease in the first pair 841+842 when the proof masses move in the negative z-direction (because the overlap between rotor and stator combs decreases) and increase when they move in the positive direction (because the overlap increases). Correspondingly, in the second pair 843+844 capacitances increase when the proof masses move in the negative z-direction and decrease when they move in the positive z-direction. The arrangement of FIG. 8c corresponds in this respect to the one in FIG. 4d.

The z-axis offsets could alternatively be made one-sided (top side or bottom side), as in FIG. 4a above. As explained in the discussion of FIGS. 4a-4c, this means that the capacitances decrease when the rotor combs move in one z-direction (as the overlap decrease), but that they stay constant when the rotor combs move in the opposite z-direction (as the overlap stays the same). Other options discussed above with reference to FIGS. 4a-4d can also be applied in the accelerometer of FIG. 8a.

We may indicate the capacitive signal obtained from the first measurement capacitor 841 by S1, and the signals obtained from the second (842), third (843) and fourth (844) measurement capacitors by S2, S3 and S4, respectively. Acceleration in the y-direction can be calculated from the differential signal S1-S2, and acceleration in the x-direction from the differential signal S3-S4. Acceleration in the z-direction can be calculated from the double-differential signal SS=(S1+S2)−(S3+S4).

In general, by constructing four separate measurement capacitors, four separate output signals S1-S4 can be obtained. If the offsets between rotor and stator combs in these four measurement capacitors are arranged according to the template presented in this example, acceleration in all three directions can be determined with two differential measurements and one double-differential measurement.

Figure 8D:
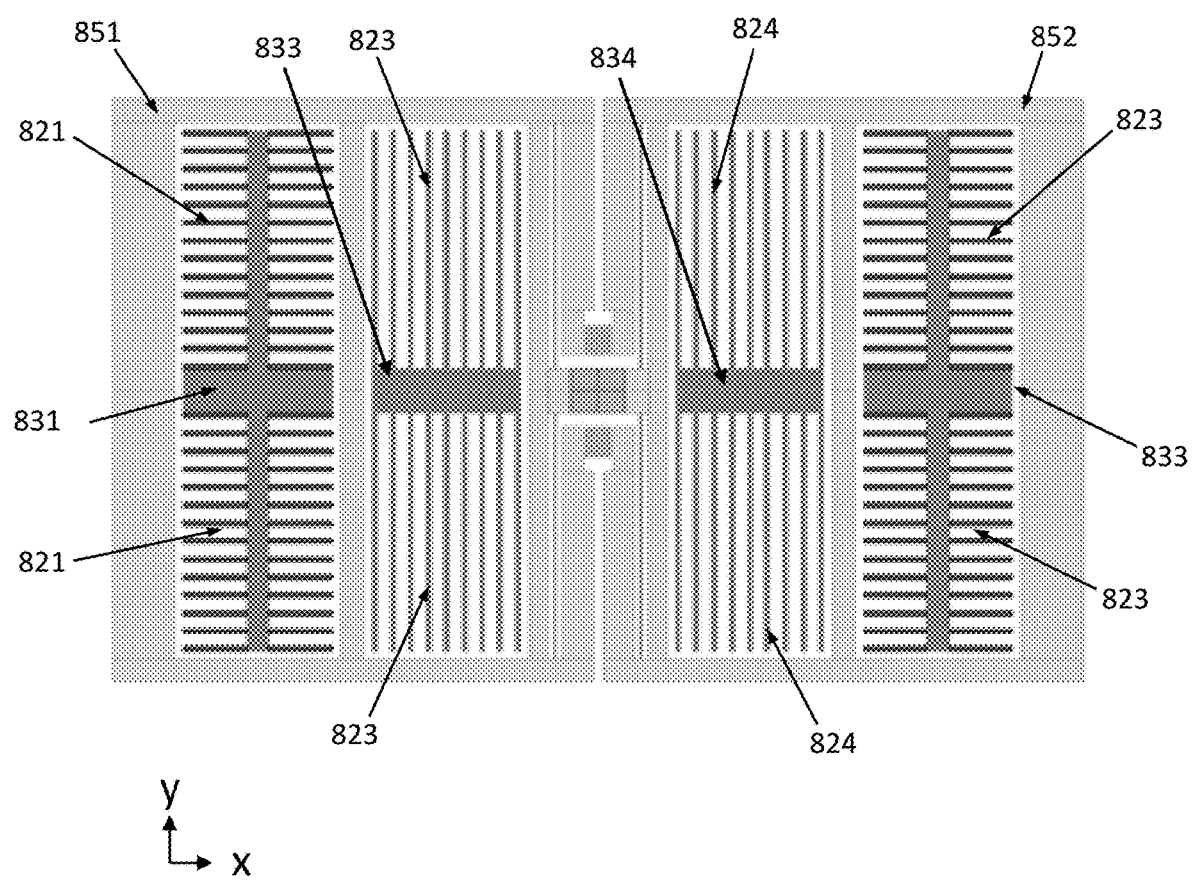

FIG. 8d illustrates an accelerometer where the design of the first and second proof masses 851-852 and their suspension and coupling arrangements corresponds to FIG. 6a, but the implementation of measurement capacitors corresponds to FIG. 8a. Rotor combs have again been omitted for clarity.

Figure 9:
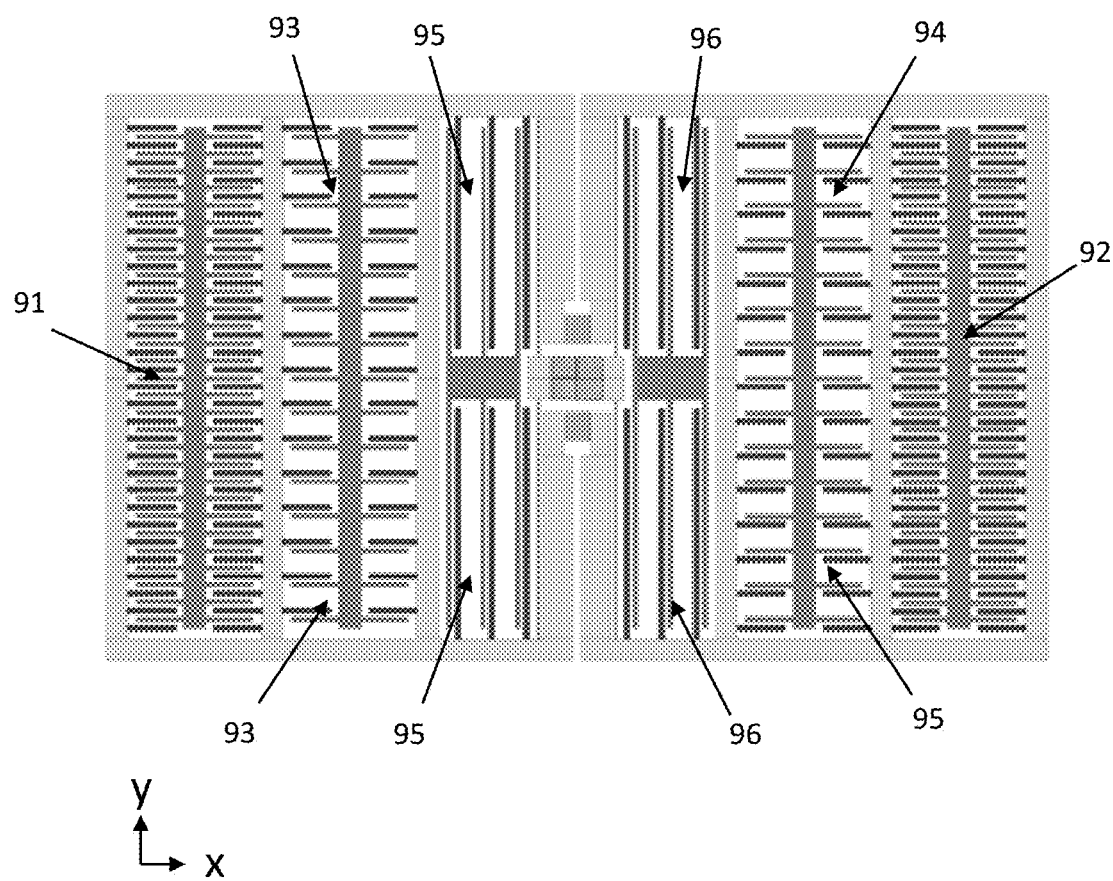
FIG. 9 illustrates an additional exemplary aspect.

FIG. 9 illustrates a final example, which is different from FIGS. 8a-8d. This accelerometer comprises six separate measurement capacitors 91-96, all of which comprise a set of stator combs interdigitated with a set of rotor combs in the xy-plane. The sets of stator combs are electrically separated from each other. Two proof masses are illustrated in FIG. 9 with the same suspension arrangement that was discussed above with reference to FIG. 6a, but the six measurement capacitors 91-96 could also be implemented on a single proof mass or on two proof masses suspended in some other way. The two proof masses in FIG. 9 are mobile in the x-, y- and z-directions.

The position of the rotor combs in the first measurement capacitor 91 has a negative offset in the z-direction in relation to the stator combs in that capacitor, while the position of the stator combs in the second measurement capacitor 92 has a negative offset in the z-direction in relation to the rotor combs in that capacitor. The offsets in the z-direction are not visible in FIG. 9. A differential signal measured from the first and second capacitors is proportional to z-axis displacement.

The position of the rotor combs in the third measurement capacitor 93 has a negative offset in the y-direction in relation to the stator combs in that capacitor, while the position of the rotor combs in the fourth measurement capacitor 94 has a positive offset in the y-direction in relation to the stator combs in that capacitor. A differential signal measured from the third and fourth capacitors is proportional to y-axis displacement.

The position of the rotor combs in the fifth measurement capacitor 95 has a negative offset in the x-direction in relation to the stator combs in that capacitor, while the position of the rotor combs in the sixth measurement capacitor 96 has a positive offset in the x-direction in relation to the stator combs in that capacitor. A differential signal measured from the fifth and sixth capacitors is proportional to x-axis displacement.

The device x- and y-measurements in capacitors 93-96 could alternatively be implemented with the alternating comb arrangement illustrated for example in FIG. 3c.

In general, it is noted that the exemplary embodiments described above are intended to facilitate the understanding of the present invention and are not intended to limit the interpretation of the present invention. The present invention may be modified and/or improved without departing from the spirit and scope thereof, and equivalents thereof are also included in the present invention. That is, exemplary embodiments obtained by those skilled in the art applying design change as appropriate on the embodiments are also included in the scope of the present invention as long as the obtained embodiments have the features of the present invention. For example, each of the elements included in each of the embodiments, and arrangement, materials, conditions, shapes, sizes, and the like thereof are not limited to those exemplified above and may be modified as appropriate. It is to be understood that the exemplary embodiments are merely illustrative, partial substitutions or combinations of the configurations described in the different embodiments are possible to be made, and configurations obtained by such substitutions or combinations are also included in the scope of the present invention as long as they have the features of the present invention.

What is claimed:

1. A microelectromechanical accelerometer comprising:
at least one proof mass in a device layer that defines an xy-plane and a z-direction that is perpendicular to the xy-plane, with the at least one proof mass including a plurality of rotor combs that extend in an x-direction of the xy-plane;
four fixed sets of stator combs that extend in the x-direction and that are each electrically insulated from the other sets of stator combs, and each set of stator combs is interdigitated with rotor combs, such that the four sets of stator combs form a set of four measurement capacitors together with the rotor combs of the at least one proof mass;
wherein the at least one proof mass is configured to move at least in a y-direction of the xy-plane and the z-direction relative to the four sets of stator combs,
wherein the set of four measurement capacitors comprises first, second, third and fourth pairs,
wherein a position of the rotor combs has a positive offset in the y-direction in relation to stator combs in the first pair when the at least one proof mass is in a rest position, such that respective capacitances increase in the first pair when the at least one proof mass moves away from the rest position in a positive y-direction and decrease when the at least one proof mass moves away from the rest position in a negative y-direction,
wherein the position of the rotor combs has a negative offset in the y-direction in relation to the stator combs in the second pair when the at least one mass is in the rest position, such that respective capacitances decrease in the second pair when the at least one proof mass moves away from the rest position in the positive y-direction and increase when the at least one proof mass moves away from the rest position in the negative y-direction,
wherein the position of the rotor combs has a negative offset in the z-direction in relation to the stator combs in the third pair when the at least one proof mass is in a respective rest position, such that respective capacitances decrease in the third pair when the at least one proof mass moves away from the rest position in a negative z-direction, and increase or remain constant when the at least one proof mass moves away from the rest position in a positive z-direction, and
wherein the position of the stator combs has a negative offset in the z-direction in relation to the rotor combs in the fourth pair when the at least one proof mass is in the rest position, so that respective capacitances decrease in the fourth pair when the at least one proof mass moves away from the rest position in a positive z-direction, and increase or remain constant when the at least one proof mass moves away from the rest position in a negative z-direction.

2. The microelectromechanical accelerometer according to claim 1, wherein the at least one proof mass comprises a first side and a second side that is opposite to the first side in the x-direction that is perpendicular to the y-direction.

3. The microelectromechanical accelerometer according to claim 2, wherein the set of four measurement capacitors comprises a first, a second, a third and a fourth measurement capacitor, and the first and second measurement capacitors are disposed on the first side of the at least one proof mass, and the third and fourth measurement capacitors are disposed on the second side of the at least one proof mass.

4. A microelectromechanical accelerometer according to claim 2, wherein the stator combs of the first measurement capacitor all have a larger y-coordinate than any of the stator combs of the second measurement capacitor, so that the first measurement capacitor is separated from the second measurement capacitor in the y-direction.

5. A microelectromechanical accelerometer according to claim 4, wherein the stator combs of the third measurement capacitor all have a larger y-coordinate than any of the stator combs of the fourth measurement capacitor, so that the third measurement capacitor is separated from the fourth measurement capacitor in the y-direction.

6. A microelectromechanical accelerometer according to claim 2, wherein the stator combs of the first measurement capacitor are arranged in an alternating order in the y-direction with the stator combs of the second measurement capacitor, so that each rotor comb in the first and second measurement capacitors is flanked by one stator comb from the first measurement capacitor on one y-direction side and by one stator comb from the second measurement capacitor on the opposite y-direction side.

7. A microelectromechanical accelerometer according to claim 6, wherein the stator combs of the third measurement capacitor are arranged in an alternating order in the y-direction with the stator combs of the fourth measurement capacitor, so that each rotor comb in the third and fourth measurement capacitors is flanked by one stator comb from the third measurement capacitor on one y-direction side and by one stator comb from the fourth measurement capacitor on the opposite y-direction side.

8. The microelectromechanical accelerometer according to claim 1, wherein the at least one proof mass consists of a first proof mass and a second proof mass.

9. The microelectromechanical accelerometer according to claim 8, wherein the first proof mass is suspended from one or more fixed anchor points by a first suspension structure, and the second proof mass is suspended from the one or more fixed anchor points by a second suspension structure.

10. The microelectromechanical accelerometer according to claim 9, wherein the first proof mass is coupled to the second proof mass by a coupling structure.

11. The microelectromechanical accelerometer according to claim 10, wherein the first and second suspension structures and the coupling structure configure the first proof mass and the second proof mass to rotate simultaneously out of a device plane in opposite rotational directions about respective rotation axes that extend in the y-direction when the accelerometer accelerates in the z-direction.

12. The microelectromechanical accelerometer according to claim 10, wherein the first and second suspension structures and the coupling structure configure the first proof mass and the second proof mass to move simultaneously in linear translation in the z-direction when the accelerometer accelerates in the z-direction.

13. The microelectromechanical accelerometer according to claim 11, wherein the first and second suspension structures and the coupling structure configure the first proof mass and the second proof mass to rotate simultaneously in the xy-plane in opposite rotational directions when the accelerometer accelerates in the y-direction.

14. The microelectromechanical accelerometer according to claim 12, wherein the first and second suspension structures and the coupling structure configure the first proof mass and the second proof mass to rotate simultaneously in the xy-plane in opposite rotational directions when the accelerometer accelerates in the y-direction.

15. The microelectromechanical accelerometer according to claim 11, wherein the first and second suspension structures and the coupling structure configure the first proof mass and the second proof mass to move simultaneously in linear translation in the y-direction when the accelerometer accelerates in the y-direction.

16. The microelectromechanical accelerometer according to claim 12, wherein the first and second suspension structures and the coupling structure configure the first proof mass and the second proof mass to move simultaneously in linear translation in the y-direction when the accelerometer accelerates in the y-direction.

17. The microelectromechanical accelerometer according to claim 1, wherein:
the at least one proof mass comprises additional rotor combs that extend in the y-direction,
the accelerometer further comprises four fixed sets of additional stator combs that extend in the y-direction and that art electrically insulated from each other and from the four sets of stator combs, and each set of additional stator combs is interdigitated with additional rotor combs, such that the four sets of additional stator combs form a set of four additional measurement capacitors together with the additional rotor combs,
the at least one proof mass is configured to move in the x-direction in relation to the fixed sets of additional stator combs,
the set of four additional measurement capacitors comprises a first additional pair and a second additional pair,
respective positions of the additional rotor combs have a positive offset in the x-direction in relation to the additional stator combs in the first additional pair when the at least one proof mass is in the rest position, so that respective capacitances increase in the first additional pair when the at least one proof mass moves away from the rest position in a positive x-direction and decrease when the at least one proof mass moves away from the rest position in a negative x-direction, and
the respective position of the additional rotor combs has a negative offset in the x-direction in relation to the additional stator combs in the second additional pair when the at least one proof mass is in the rest position, so that respective capacitances decrease in the second additional pair when the at least one proof mass moves away from the rest position in a positive x-direction and increase when the at least one proof mass moves away from the rest position in a negative x-direction.

18. The microelectromechanical accelerometer according to claim 17, wherein the set of four additional measurement capacitors also comprises a third additional pair and a fourth additional pair, and wherein:
the position of additional rotor combs has a negative offset in the z-direction in relation to additional stator combs in the third additional pair when the at least one proof mass is in the rest position, so that respective capacitances decrease in the third additional pair when the at least one proof mass moves away from the rest position in a negative z-direction, and increase or remain constant when the at least one proof mass moves away from the rest position in a positive z-direction, and
the position of additional stator combs has a negative offset in the z-direction in relation to additional rotor combs in the fourth additional pair when the at least one proof mass is in the rest position, so that respective capacitances decrease in the fourth additional pair when the at least one proof mass moves away from the rest position in a positive z-direction, and increase or remain constant when the at least one proof mass moves away from the rest position in a negative z-direction.

19. The microelectromechanical accelerometer according to claim 1, wherein the at least one proof mass consists of a first proof mass and a second proof mass, with the first proof mass being suspended from one or more anchor points by a first suspension structure, and the second proof mass being suspended from the one or more anchor points by a second suspension structure, and the first proof mass being coupled to the second proof mass with a coupling structure.

20. The microelectromechanical accelerometer according to claim 19, wherein:
- the first and second suspension structures and the coupling structure configure the first proof mass and the second proof mass to rotate simultaneously out of a device plane in opposite rotational directions about respective rotation axes that extend in the x-direction when the accelerometer accelerates in the z-direction, and
- the first and second suspension structures and the coupling structure configure the first proof mass and the second proof mass to move in linear translation in the y-direction when the accelerometer accelerates in the y-direction.

* * * * *